(12) United States Patent  
Rudolph

(10) Patent No.: US 9,835,674 B2
(45) Date of Patent: Dec. 5, 2017

(54) METHOD FOR IDENTIFYING ONE OR MORE SIMULTANEOUSLY OCCURRING PARTIAL DISCHARGE SOURCES

(71) Applicant: Olaf Rudolph, Hambrücken (DE)

(72) Inventor: Olaf Rudolph, Hambrücken (DE)

( * ) Notice: Subject to any disclaimer, the term of this patent is extended or adjusted under 35 U.S.C. 154(b) by 372 days.

(21) Appl. No.: 14/345,397

(22) PCT Filed: Sep. 17, 2012

(86) PCT No.: PCT/EP2012/068272
§ 371 (c)(1),
(2) Date: Mar. 17, 2014

(87) PCT Pub. No.: WO2013/038017
PCT Pub. Date: Mar. 21, 2013

(65) Prior Publication Data
US 2014/0340096 A1   Nov. 20, 2014

(30) Foreign Application Priority Data

Sep. 16, 2011   (DE) .................. 10 2011 082 866

(51) Int. Cl.
G01R 31/08 (2006.01)
G01R 31/12 (2006.01)
H01H 9/50 (2006.01)

(52) U.S. Cl.
CPC ......... *G01R 31/1272* (2013.01); *G01R 31/08* (2013.01); *G01R 31/1254* (2013.01); *G01R 31/1281* (2013.01)

(58) Field of Classification Search
CPC ...... H02H 1/0015; H02H 3/162; G01R 31/11; H01H 33/26; H01J 37/32944

(Continued)

(56) References Cited

U.S. PATENT DOCUMENTS 4,917,365 A * 4/1990 Stemmler ............ B65H 3/325
  270/58.34
4,949,001 A * 8/1990 Campbell ............ G01R 31/343
  174/DIG. 17

(Continued)

FOREIGN PATENT DOCUMENTS

DE     102009034062 A1   8/2010
EP        2275974 A2    1/2011

OTHER PUBLICATIONS

H. Al-Marzouqi, The Density Based Segmentation Algorithm for Interpreting Partial Discharge Data, International Conference on Solid Dielectrics, Jul. 4, 2010, pp. 1-3, Piscataway, New Jersey, US.

(Continued)

*Primary Examiner* — Giovanni Astacio-oquendo
(74) *Attorney, Agent, or Firm* — Bachman & LaPointe, P.C.

(57) ABSTRACT

A method for identifying one or more simultaneously occurring partial discharge sources from partial discharge measurement signals of an electrical device to which an AC voltage is applied includes determining area parameters of at least one enclosed area of partial discharge pulse matrix arrays. For each enclosed area of partial discharge pulse matrix arrays, area parameters of the enclosed area of partial discharge pulse matrix arrays are compared to predetermined rule sets. Predetermined fault rules are applied which allocate characteristic partial discharge pulse area basic forms and characteristic combinations of partial discharge pulse area basic forms to known partial discharge sources, to the ascertained partial discharge pulse area basic forms in order to determine those partial discharge sources which have rendered the corresponding partial discharge pulses.

16 Claims, 16 Drawing Sheets

(58) Field of Classification Search
USPC .......................................... 324/536, 500, 512
See application file for complete search history.

(56) References Cited

U.S. PATENT DOCUMENTS

| | | | | |
|---|---|---|---|---|
| 5,004,530 | A * | 4/1991 | Tanaka | B23H 1/10 204/224 M |
| 6,507,181 | B1 * | 1/2003 | Pakonen | G01R 31/12 324/536 |
| 6,774,639 | B1 * | 8/2004 | Unsworth | G01R 31/1227 324/535 |
| 7,532,012 | B2 * | 5/2009 | Cern | G01R 31/1272 324/536 |
| 7,676,333 | B2 * | 3/2010 | Younsi | G01R 31/343 324/458 |
| 7,741,848 | B1 * | 6/2010 | Olsson | G01V 3/15 324/326 |
| 2004/0204873 | A1 * | 10/2004 | Freisleben | G01R 31/1272 702/57 |
| 2005/0012507 | A1 * | 1/2005 | Kaneda | G01R 31/343 324/536 |
| 2005/0156600 | A1 * | 7/2005 | Olsson | G01S 7/03 324/329 |
| 2007/0216396 | A1 * | 9/2007 | Coulson | H02M 3/33507 324/117 R |
| 2009/0119035 | A1 | 5/2009 | Younsi et al. | |
| 2010/0188245 | A1 * | 7/2010 | Nielsen | G01V 3/15 340/686.1 |
| 2014/0271965 | A1 * | 9/2014 | Ferrar | B29C 67/0085 425/163 |

OTHER PUBLICATIONS

A. Krivda et al., Recognition of Multiple Partial Discharge Patterns, High Voltage Engineering Symposium, Aug. 23, 1999, pp. 17-20, London, GB.

International Search Report for PCT/EP2012/068272, dated Jan. 28, 2013.

Written Opinion of the International Search Authority for PCT/EP2012/068272, dated Mar. 16, 2014.

Segmentierung, original German and robot translation of Wikipedia article, archived version dated Apr. 2, 2011, retrieved Nov. 27, 2015 from http://de.wikipedia.org/w/index.php?title=Segmentierung_(Bildverarbeitung)&oldid=87205437.

Schwellwertverfahren, original German and robot translation of Wikipedia article, archived version dated May 17, 2011 retrieved Nov. 27, 2015 from http://de.wikipedia.org/w/index.php?title=Schwellwertverfahren&oldid=88957960.

Fractale Dimension, original German and robot translation of Wikipedia article, archived version dated Apr. 9, 2011, retrived Nov. 27, 2015 from http://de.wikipedia.org/w/index.php?=Fraktale_Dimension&oldid=87486215.

German Office action for German Patent Application No. 10 2011 082 866.4, dated Jul. 11, 2012.

* cited by examiner

| Actual values | Area 1 | Area 2 | Area 3 |
|---|---|---|---|
| AreaShare | 0.592 | 0.576 | 0.457 |
| Aspect | 0.769 | 3.667 | 1.4 |
| FreeCorners | 2 | 2 | 2 |
| FreeSides | 2 | 3 | 4 |
| Left Turn | 2 | 0 | 2 |
| Top Turn | -11 | 0 | -2 |
| Right Turn | 0 | -3 | 0 |
| Bottom Turn | 1 | 0 | 1 |
| H-Sym | 0.492 | 0.727 | 0.229 |
| V-Sym | 0.877 | 0.061 | 0.229 |

| Allocation | Sickle | Fin | Tower |
|---|---|---|---|
| Area 1 | 45% | 99% | 31% |
| Area 2 | 22% | 53% | 85% |
| Area 3 | 75% | 67% | 0% |

METHOD FOR IDENTIFYING ONE OR MORE SIMULTANEOUSLY OCCURRING PARTIAL DISCHARGE SOURCES

CROSS-REFERENCE TO RELATED APPLICATIONS

This is a 371 US national stage application of PCT/EP2012/068272, filed Sep. 17, 2012, and entitled "Method for Identifying One or More Simultaneously Occurring Partial Discharge Sources" and priority is claimed of German Patent Application No. 102011082866.4, filed Sep. 16, 2011.

BACKGROUND OF THE INVENTION

The present invention relates to a method for identifying one or more simultaneously occurring partial discharge sources from partial discharge measurement signals of an electrical device to which an AC voltage is applied.

Partial discharges occur in electrical devices to which an AC voltage is applied if there are weak spots in the electrical insulation. A prominent example thereof are partial discharges that occur in particular in high-voltage power lines or the porcelain insulators affixing them to the towers when it is raining or the weather is damp, and are usually perceived as a crackling sound. In the open air, such partial discharges are non-critical. However, if they occur in encapsulated devices, they might cause a sparkover and destroy the device, especially if, for space saving reasons, the lines and devices are installed in gas-insulated switching systems filled with pressurized insulating gas.

In a gas-insulated system, a partial discharge may be caused by factors such as contaminations in the gas-insulated system, internal defects such as scratches or burrs on the inside of the housing or the inner conductor, or inaccurate assembly. Such partial discharges have a great impact on the operating performance of the gas-insulated system and might cause disastrous accidents if they are not identified early on.

The monitoring and evaluation of such gas-insulated systems is therefore an important instrument for preventive maintenance and the avoidance of disruptive incidents.

External and internal sensors for detecting partial discharges are, for example, known from DE 10 2009 034 062 A1. Such sensors detect partial discharge signals occurring in a gas-insulated system. Although partial discharges can be measured with such sensors, it has thus far not, or not in a satisfactory manner, been possible to allocate the measured partial discharges to the actual partial discharge sources. To date, it has not been possible to identify a plurality of simultaneously occurring partial discharge sources.

As a consequence, there is a need for a reliable and unambiguous identification of partial discharge sources from measured partial discharge measurement signals, in particular when a plurality of partial discharge sources in electrical devices to which an AC voltage is applied occur simultaneously.

SUMMARY OF THE INVENTION

This problem is solved by the subject matter of the independent claim; advantageous embodiments result from the dependent claims.

A method according to the invention for identifying one or more simultaneously occurring partial discharge sources from partial discharge measurement signals of an electrical device to which an AC voltage is applied, in particular a gas-insulated system, a high-voltage generator, a transformer, an electrical high-voltage power line or an electrical cable, comprises the following steps:

on the basis of a frequency matrix into which measured partial discharge pulses are entered as partial discharge pulse matrix arrays according to the detected pulse amplitude and to the detected phase position and in which partial discharge pulse matrix arrays are allocated to at least one enclosed area of partial discharge pulse matrix arrays, determining area parameters of the at least one enclosed area of partial discharge pulse matrix arrays;

comparing, for each enclosed area of partial discharge pulse matrix arrays, area parameters of the enclosed area of partial discharge pulse matrix arrays to predetermined rule sets, with each rule set corresponding to a characteristic partial discharge pulse area basic form; and allocating, for each enclosed area of partial discharge pulse matrix arrays, that rule set to the enclosed area which best corresponds to the enclosed area, such that one partial discharge pulse area basic form is allocated to each enclosed area of partial discharge pulse matrix arrays;

applying predetermined fault rules, which allocate characteristic partial discharge pulse area basic forms and characteristic combinations of partial discharge pulse area basic forms to known partial discharge sources, to the ascertained partial discharge pulse area basic forms in order to determine those partial discharge sources which have rendered the corresponding partial discharge pulses.

The method according to the invention makes it possible to reliably identify and determine a plurality of simultaneously occurring partial discharge sources from partial discharge measurement signals in an automated manner.

This method unambiguously and reliably identifies both separately occurring partial discharge sources and one or more simultaneously occurring and overlapping partial discharge sources.

The method according to the invention allows for a comprehensive cause analysis of occurring partial discharges. Critical partial discharge sources can be identified and removed quickly, unambiguously and reliably. In particularly critical cases, damages can be prevented by an immediate emergency shutdown.

The method according to the invention also allows for a comprehensive trend analysis of occurring partial discharges. When the method according to the invention is repeatedly applied to the same electrical device to which an AC voltage is applied, it is possible to detect how the identified partial discharge sources develop, thus providing additional safety.

The automated evaluation allows for a simple and reliable identification of one or more simultaneously occurring partial discharge sources from partial discharge measurement signals of an electrical device to which an AC voltage is applied without having to consult experts, thus saving costs.

The electrical device to which an AC voltage is applied may be any device in which electrical partial discharges occur, such as a gas-insulated system, a high-voltage generator, a transformer, an electrical high-voltage power line or an electrical cable.

The method according to the invention allows for a differentiated evaluation of individual signal sources rather than for only one integrative overall evaluation of the complete measurement signal, thus suppressing influences of unavoidable interfering signals, on the one hand, and compensating typical stochastic variations in the evaluation of the amplitude and phase position of individual partial discharge pulses, on the other. Furthermore, the separation of the individual partial discharge sources allows for tailored repair measures or otherwise suitable countermeasures.

The form identification according to the invention, as it is specified in greater detail in the dependent claims, offers the advantages that the respectively analyzed chain length considered is limited to the core and the method according to the invention also works in case of frayed forms; that the method according to the invention can simply be expanded by further forms; and that, by merging basic forms, more complex forms can be identified as well.

The advantages resulting from the analysis of chain lengths as specified in greater detail in the dependent claims, compared to statistical methods such as calculating the mean value, variance, inclination and curvature, are that the interfering signals are separated from the reference data, which leads to significantly better results, whereas statistical methods include them in the sum; and that the identification of chain lengths allows for more differentiated findings, whereas statistical methods only yield integrated values.

The advantages of the analysis of chain lengths as specified in greater detail in the dependent claims, compared to neural networks, are that this approach is resistant to a variation in resolution and works independently of the size of the form; that it is position-independent; and that it requires no training data.

The advantages of the analysis of chain lengths according to the invention as specified in greater detail in the dependent claims, compared to hierarchical cluster methods are that the number of the clusters/forms does not need to be known beforehand, as is the case, for example, in the k-means approach; and that the approach according to the invention is real time-capable, in particular also in the case of a large number of TIMs, making it possible to use it not only in the subsequent analysis, but also online in monitoring systems.

The advantages of the probability-based rule system with continuous functions, which can be used according to the invention and is specified in greater detail in the dependent claims, are that the output of a list of probabilities of the association with a specific form or discharge provides information about the certainty of the analysis; that the result leads to a very reliable conclusion regarding the certainty of the analysis result, since all forms and many rules, respectively, are calculated for each area; that by focusing on core areas of the forms, deviations of the measuring accuracies as well as frequently occurring phenomena such as scattering or jitting of the measurement signal are compensated; and that a comparison of the individual measurement with empirical values of previous or subsequent measurements by identifying the areas and groups by means of their parameters also allows for the comparison of two measurements, whereby serial measurements identify groups and/or area-specific trends.

The frequency matrix into which the measured partial discharge pulses are entered as partial discharge pulse matrix arrays according to a detected pulse amplitude and to a detected phase position may, for example, be provided by suitable hardware or software or may also be produced itself in accordance with the method according to the invention.

The allocation of the partial discharge pulse matrix arrays to at least one enclosed area of partial discharge pulse matrix arrays may, for example, have already been carried out by means of suitable hardware or software, such that the method according to the invention is based on a frequency matrix in which the partial discharge pulse matrix arrays are already allocated to at least one enclosed area of partial discharge pulse matrix arrays. Such allocation may furthermore be able to be carried out by itself by means of the method according to the invention, as will be explained in the following in greater detail.

According to a first embodiment of the method according to the invention, the properties length of contiguous partial discharge pulse matrix arrays in the horizontal direction, length of contiguous partial discharge pulse matrix arrays in the vertical direction, length of contiguous partial discharge pulse matrix arrays in the diagonally ascending direction and length of contiguous partial discharge pulse matrix arrays in the diagonally descending direction are at the outset allocated for each partial discharge pulse array when allocating the partial discharge pulse matrix arrays in the frequency matrix to at least one enclosed area of partial discharge pulse matrix arrays. This is a simple and effective calculation of the extension of the partial discharge pulse matrix arrays in all directions.

According to another embodiment of the method according to the invention, the partial discharge pulse matrix arrays in the frequency matrix are allocated to at least one enclosed area of partial discharge pulse matrix arrays according to their chain lengths. By general definition, the term "chain length" is understood as the length of partial discharge pulse matrix arrays contiguously aligned in a linear row in an arbitrary direction.

According to another embodiment of the method according to the invention, the property length of contiguous partial discharge pulse matrix arrays in the horizontal direction is, for each partial discharge pulse array, put into relation with the property length of contiguous partial discharge pulse matrix arrays in the vertical direction when allocating the partial discharge pulse matrix arrays in the frequency matrix to at least one enclosed area of partial discharge pulse matrix arrays in order to determine the deduced property cross-aspect, and/or wherein for each partial discharge pulse array, the property length of contiguous partial discharge pulse matrix arrays in the diagonally ascending direction is put into relation with the property length of contiguous partial discharge pulse arrays in the diagonally descending direction in order to determine the deduced property diagonal aspect. This is a simple and effective calculation of the relevant properties of surface extension for each partial discharge pulse array. In this embodiment, the length of the respective partial discharge pulse matrix arrays that are linearly aligned in the horizontal direction is thus a first chain length; the length of the partial discharge pulse matrix arrays that are linearly aligned in the vertical direction a second chain length; the length of the respective partial discharge pulse matrix arrays that are linearly aligned in the diagonally ascending direction a third chain length; and the length of the respective partial discharge pulse matrix arrays that are linearly aligned in the diagonally descending direction a fourth chain length.

According to another embodiment of the method according to the invention, the properties cross aspect and diagonal aspect are used for adjacent partial discharge pulse matrix arrays when allocating the partial discharge pulse matrix arrays in the frequency matrix to at least one enclosed area of partial discharge pulse matrix arrays in order to determine whether or not adjacent partial discharge pulse matrix arrays belong to the same enclosed area. This is a simple, but very relevant criterion for grouping partial discharge pulse matrix arrays into the same or different areas.

According to another embodiment of the method according to the invention, the deviation of a partial discharge pulse array from the respective horizontally, vertically and diagonally adjacent partial discharge pulse matrix arrays is determined in pairs for all partial discharge pulse matrix arrays when allocating the partial discharge pulse matrix arrays in the frequency matrix to at least one enclosed area of partial discharge pulse matrix arrays, wherein the deduced properties cross aspect and diagonal aspect are used for this determination of similarity. This is a simple, but very relevant criterion for grouping partial discharge pulse matrix arrays into the same or different areas.

According to another embodiment of the method according to the invention, when allocating the partial discharge pulse arrays in the frequency matrix to at least one enclosed area of partial discharge pulse matrix arrays, the cross deviation is, for each partial discharge pulse array, determined according to the following formula:

$$\text{cross deviation} = \text{abs}\left(\frac{\text{minimum(cross aspect point, cross aspect adjacent point)}}{\text{maximum(cross aspect point, cross aspect adjacent point)}} - 1\right),$$

the diagonal deviation according to the following formula:

$$\text{diagonal deviation} = \text{abs}\left(\frac{\text{minimum}\left(\begin{array}{c}\text{diagonal aspect point,}\\ \text{diagonal aspect adjacent point}\end{array}\right)}{\text{maximum}\left(\begin{array}{c}\text{diagonal aspect point,}\\ \text{diagonal aspect adjacent point}\end{array}\right)} - 1\right)$$

and the deviation between the cross deviation and the diagonal deviation according to the following formula:

deviation=max(cross deviation,diagonal deviation).

This is a simply executable calculation which provides accurate results.

This calculation may be done first row by row and subsequently column by column, starting from bottom left. Different run sequences are also possible.

According to another embodiment of the method according to the invention, the horizontally, vertically or diagonally adjacent partial discharge pulse array having the greatest possible still admissible deviation below a predetermined critical maximum deviation is determined for each partial discharge pulse array. This is a simple, but very relevant criterion for grouping partial discharge pulse matrix arrays into the same or different areas.

This procedure may start with the adjacent partial discharge pulse array arranged subjacently and diagonally to the left and then proceed from bottom to top and column by column to the right. Other run sequences are also possible.

According to another embodiment of the method according to the invention, the partial discharge pulse matrix arrays in the frequency matrix are allocated to at least one enclosed area of partial discharge pulse matrix arrays by sequentially analyzing, for each partial discharge pulse array, the considered partial discharge pulse array and the horizontally, vertically or diagonally adjacent partial discharge pulse array having the greatest still admissible deviation below a predetermined critical maximum deviation, and by, if both partial discharge pulse matrix arrays do not yet have an area number, allocating a new area number to the considered partial discharge pulse array; if the area number of the adjacent partial discharge pulse array is higher than the area number of the considered partial discharge pulse array, allocating the area number of the adjacent partial discharge pulse array to considered the partial discharge pulse array; and if neither of the two conditions is met, maintaining the area number of the partial discharge pulse array and continuing with the allocation of the next partial discharge pulse array. This is an easy way of allocating the partial discharge pulse matrix arrays to the same or different areas.

According to another embodiment of the method according to the invention, this allocation is repeated for all partial discharge pulse arrays until the area numbers no longer change.

According to another embodiment of the method according to the invention, those arrays which are not partial discharge pulse matrix arrays are not considered when allocating the partial discharge pulse matrix arrays in the frequency matrix to at least one enclosed area of partial discharge pulse matrix arrays.

According to another embodiment of the method according to the invention, a partial discharge pulse array is only allocated if the deviation for the considered partial discharge pulse array is below a predetermined maximum deviation value, which ranges between 0.6 and 0.8 and is preferably approx. 0.7; otherwise the procedure continues with the allocation of the next partial discharge pulse array.

According to another embodiment of the method according to the invention, all partial discharge pulse matrix arrays the area of which is too small are removed when allocating the partial discharge pulse matrix arrays in the frequency matrix to at least one enclosed area of partial discharge pulse matrix arrays, wherein an area is in particular too small if it comprises, depending on the resolution of the output partial discharge matrix, for example, less than 10 partial discharge pulse matrix arrays, and/or if the horizontal or vertical extension thereof is smaller than 8 partial discharge pulse matrix arrays. As a consequence, the subsequent calculation is, according to the resolution/size of the output partial discharge matrix, simplified and focused on the areas of relevant size.

According to another embodiment of the method according to the invention, the area parameters for the at least one enclosed area of partial discharge pulse matrix arrays are at least one area parameter from the following group:

Area share=number of the partial discharge pulse matrix arrays in the enveloping rectangle/number of all matrix arrays in the enveloping rectangle; aspect ratio of the enveloping rectangle=vertical extension/horizontal extension of the enveloping rectangle; free corners of the enveloping rectangle=corners of the enveloping rectangle at which all matrix arrays are free; free side centers of the enveloping rectangle=side centers of the enveloping rectangle at which all matrix arrays are free; curvature to the left; curvature to the right; curvature on the top; curvature on the bottom; vertical symmetry=symmetry around the vertical center axis; and horizontal symmetry=symmetry around the horizontal center axis.

Such area parameters allow for a simple and almost complete characterization of the ascertained areas of partial discharge pulse matrix arrays with respect to their surface characteristic, thus achieving very accurate allocation results.

According to another embodiment of the method according to the invention, the basic forms are at least one of the basic forms from the following group: Spot; Hill; Flame; Tower; Sickle; Fin; Platform.

According to another embodiment of the method according to the invention, a probability value is, during the step of comparing the area parameters for the enclosed area of partial discharge pulse matrix arrays to predetermined rule sets for each enclosed area of partial discharge pulse matrix arrays, allocated to each enclosed area, said probability value corresponding to the probability of the conformity of the enclosed area with the basic form of a characteristic partial discharge source signal. The allocation of probability values to the enclosed areas allows for a knowledgeable conclusion as to whether or not and how an enclosed area is similar to a particular basic form.

According to another embodiment of the method according to the invention, the probability of the conformity of the actual value with the target value is calculated by means of a continuous function.

At least one of the functions $$F1 := e^{-ln(tolerance\ value)} \left( \frac{actual\ value - target\ value}{tolerance\ width} \right)^2$$

$$F2 := 0.5 + \arctan(normalization * (deviation - actual\ value))$$

$$F3 := 0.5 - \arctan(normalization * (deviation - actual\ value))$$

may be used as continuous function.

According to another embodiment of the method according to the invention, the allocation step allocates those rule sets which have the highest probability value regarding conformity to the enclosed area.

According to another embodiment of the method according to the invention, the fault rules are at least one fault rule from the following group:
Fault rule for a test set, fault rule for a detachment, fault rule for a cavity, fault rule for a sliding discharge, fault rule for a particle, fault rule for an apex/tip, fault rule for a free potential, fault rule for a crack, fault rule for a mobile telephone, fault rule for a radar signal, fault rule for amplifier noise, fault rule for an oversized input signal, fault rule for a thyristor signal.

According to another embodiment of the method according to the invention, the fault rules allocate partial discharge pulse area basic forms occurring at specific phase positions to known partial discharge sources and allocate basic forms occurring at specific phase positions and being spaced apart from one another by a specific phase shift to known causal partial discharge sources. Such fault rules are a summary of knowledge deduced from physical models and/or empirical knowledge about specific fault characteristics which repeat for the same partial discharge source According to another embodiment of the method according to the invention, the partial discharge measurement signals of the electrical device to which an AC voltage is applied are detected by means of a partial discharge sensor/partial discharge measuring device.

The invention also relates to a partial discharge measuring device which is adapted for detecting partial discharge measurement signals of an electrical device to which an AC voltage is applied, in particular a gas-insulated system, a high-voltage generator, a transformer, an electrical high-voltage power line or an electrical cable, and for carrying out a method for identifying one or more simultaneously occurring partial discharge sources of the type described above on the basis of the detected partial discharge measurement signals. Such a partial discharge measuring device allows for a fast and reliable analysis on the spot and an automatic and unambiguous allocation of the partial discharge measurement signals to the relevant partial discharge sources.

Furthermore, the invention relates to a computer program having program instructions for carrying out a method for identifying one or more simultaneously occurring partial discharge sources from partial discharge measurement signals of an electrical device to which an AC voltage is applied, in particular a gas-insulated system, a high-voltage generator, an electrical high-voltage power line or an electrical cable, said computer program being adapted for having a method of the type described above run on the basis of detected partial discharge measurement signals. Such a computer program allows for a fast and reliable analysis and an automatic and unambiguous allocation of the detected partial discharge measurement signals to the relevant partial discharge sources.

Furthermore, the invention relates to a computer system or data carrier with a computer program for carrying out a method for identifying one or more simultaneously occurring partial discharge sources from partial discharge measurement signals of an electrical device to which an AC voltage is applied, in particular a gas-insulated system, a high-voltage generator, a transformer, an electrical high-voltage power line or an electrical cable of the type described above.

BRIEF DESCRIPTION OF THE DRAWINGS

The method according to the invention for identifying one or more simultaneously occurring partial discharge sources from partial discharge measurement signals of an electrical device to which an AC voltage is applied will now be explained in greater detail by means of an example embodiment with reference to the accompanying drawings.

FIG. 1b shows a partial discharge matrix resulting from the partial discharge measurement according to FIG. 1a;

DETAILED DESCRIPTION

In the embodiment described below, partial discharge signals of an electrical device to which an AC voltage is applied are first detected by means of a partial discharge sensor or a partial discharge measuring device and the thus detected partial discharge pulses are then depicted in a so-called Φqn partial discharge matrix.

The electrical device to which an AC voltage is applied may be any device in which electrical partial discharges occur, for example a gas-insulated system, a high-voltage generator, a transformer, an electrical high-voltage power line or an electrical cable. In the present embodiment, a gas-insulated system was measured by means of the partial discharge measuring device.

The measurement time is usually predetermined and may, for example, be 60 seconds.

Figure 1A:
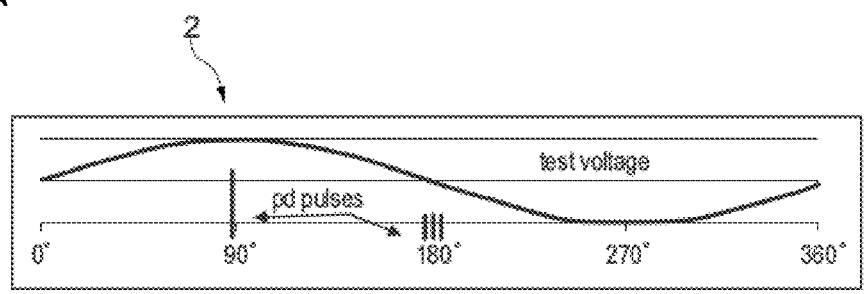
FIG. 1a shows a schematic view of an extract of a partial discharge measurement.

FIG. 1a shows a schematic view of an extract of a partial discharge measurement 2;

FIG. 1a and the following figures show, by way of example, the measurement time of a sinusoidal oscillation, which represents the AC voltage applied to the gas-insulated switching device and detected by the measuring device. The measurement time according to FIG. 1a corresponds to only a portion of the complete measurement time typically detected by a partial discharge measuring device.

FIG. 1a shows this sinusoidal oscillation of the AC voltage of the gas-insulated switching device with a sine curve from 0 to 360°, the maximum being at 90°, the zero crossing at 180°, and the minimum at 270°.

FIG. 1a depicts the partial discharge pulses detected by the partial discharge measuring device with vertical bars. As can be clearly gathered from FIG. 1a, the partial discharge measuring device has detected one partial discharge pulse at a phase position of 90° and three partial discharge pulses at a phase position of 180°. The height of the vertical bars corresponds to the pulse amplitude.

Figure 1B:
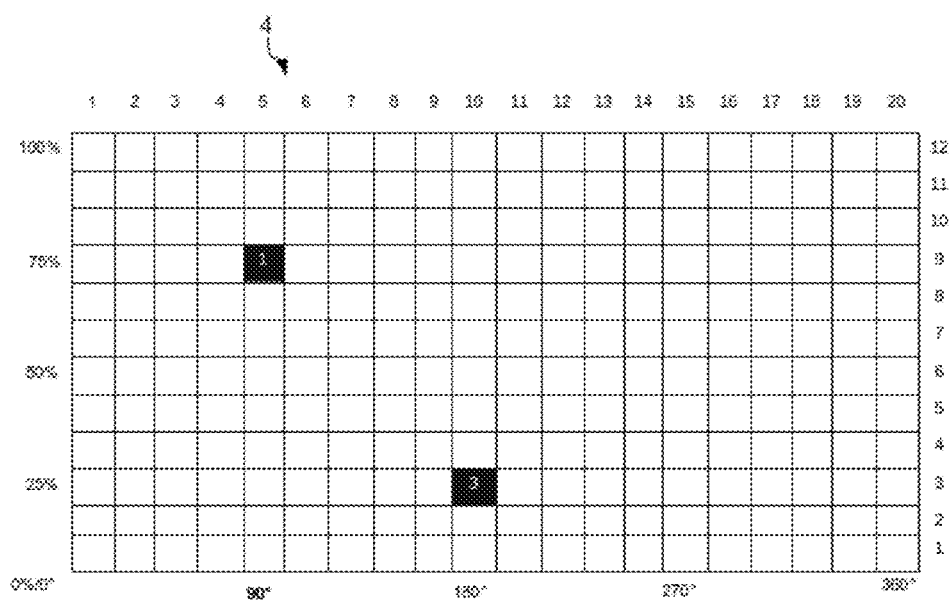

FIG. 1b shows a partial discharge matrix 4 resulting from the partial discharge measurement according to FIG. 1a.

The partial discharge pulses are entered into the partial discharge matrix 4 according to FIG. 1b, wherein the partial discharge pulses are sorted for the purpose of depicting them on the partial discharge matrix 4. With the sorting method according to FIG. 1b, the detected partial discharge pulses according to FIG. 1a were entered into the partial discharge matrix 4 based on a sorting method in which the relative phase position of the applied test AC voltage is mapped on the abscissa and the detected pulse amplitude is mapped on the ordinate.

In the partial discharge matrix 4, the matrix array with an X value corresponding to the relative phase position of 90° and a Y value corresponding to a strength of 75%, is set as a partial discharge pulse array and is assigned the number of the detected partial discharge pulses at this phase position and this pulse amplitude, namely the value 1.

Correspondingly, the matrix array having an X value of 180° and a Y value of 25% is set as a partial discharge pulse array and is assigned the value that corresponds to the number of the pulses at this phase position and this pulse amplitude, i.e. in the present example, the value 3.

In the further procedure, the number of the partial discharge pulses per partial discharge pulse array is irrelevant; each partial discharge pulse array is merely considered in a digital manner, such that, if no partial discharge pulse was detected in this partial discharge pulse array, this array is not set as a partial discharge pulse array, and wherein, if at least one partial discharge pulse was detected, the respective array is set as a partial discharge pulse array and assigned the value 1, irrespective of how many partial discharge pulses actually occurred at this phase position and the respective pulse amplitude.

The embodiment of FIGS. 1a and 1b merely serves to explain how a partial discharge matrix is generated from a partial discharge measurement.

Figure 2:
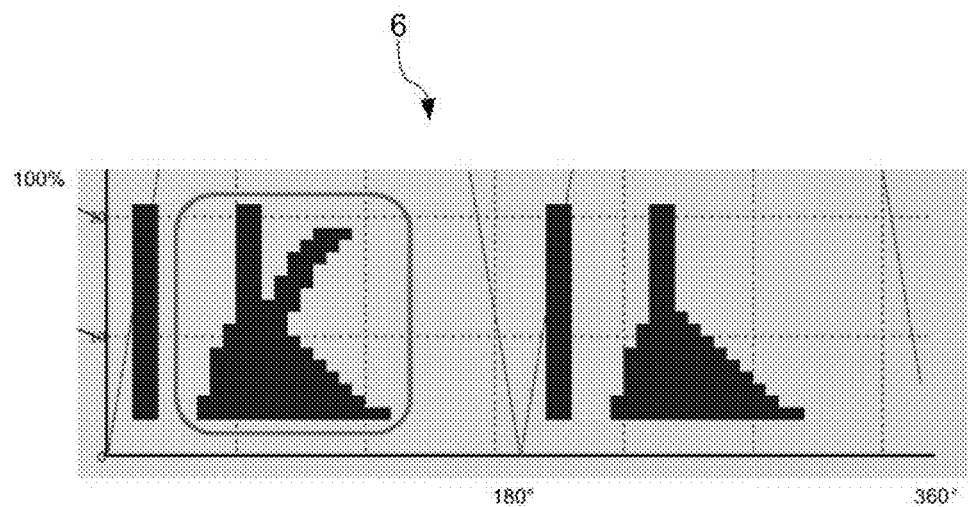
FIG. 2 shows a schematic view of a complete output partial discharge matrix.

FIG. 2 shows a schematic view of a complete output partial discharge matrix 6.

The embodiment for the method according to the invention for identifying one or more simultaneously occurring partial discharge sources from partial discharge measurement signals of an electrical device to which an AC voltage is applied is now explained with reference to the following figures, based on an exemplary complete outputbasic partial discharge matrix 6, as shown in FIG. 2. This complete output partial discharge matrix 6 was generated from a partial discharge measurement, wherein—as explained with reference to FIGS. 1a and 1b—those arrays the phase position and pulse amplitude of which have caused at least one partial discharge pulse were set as partial discharge pulse arrays.

In the complete output partial discharge matrix 6, the matrix arrays set as partial discharge pulse arrays are shown on a black background.

One vertical bar, corresponding to a number of partial discharge pulses detected at this phase position and having a strength of approx. 20% to 80%, can be seen both at a phase position of approx. 20° and approx. 200°.

Between a phase position from approx. 40° to approx. 130°, one can see a number of partial discharge pulse arrays having a form that comprises, from bottom to top, a lower triangle, a bar starting at the top thereof and extending vertically upwards, and a bar starting at the top corner thereof and extending diagonally upwards to the right. This set of partial discharge pulse arrays is shown encircled in FIG. 2 and is explained as an example in the following figures.

The horizontal basic side of the triangle is located at a height that corresponds to a pulse amplitude having a strength of 20%; the top of the triangle is located at a height that corresponds to a pulse amplitude having a strength of 50%, the upper end of the vertical bar is located at a height that corresponds to a pulse amplitude of a strength of approx. 80%, and the upper end of the diagonal bar is located at a height that corresponds to a pulse amplitude of a strength approx. 70%.

At a phase position from 240 to 330°, a comparable number of matrix arrays set as partial discharge pulse arrays is shown, the form of which can also be characterized by a triangle, the upper tip of which is the starting point of a vertical bar; there is, however, no inclined bar.

The bottom side of the triangle is located at a height that corresponds to a pulse amplitude of a strength of 20%, the top of the triangle is located at a height that corresponds to a pulse amplitude of a strength of 50%, and the upper end of the vertical bar is located at a height that corresponds to a pulse amplitude of a strength of approx. 80%.

Figure 3:
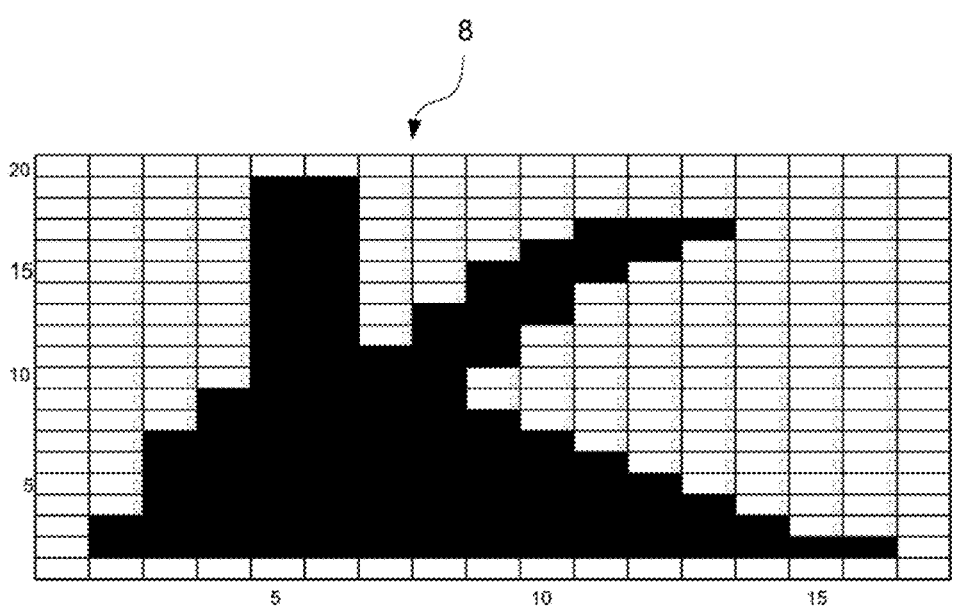
FIG. 3 shows a partial discharge matrix representing an extract of the complete output partial discharge matrix from FIG. 2.

FIG. 3 shows a partial discharge matrix 8, which represents a segment of the complete output partial discharge matrix 6.

The partial discharge matrix 8 of FIG. 3 is an isolated view of the encircled area of the complete output partial discharge matrix 6. The matrix arrays set therein as partial discharge pulse arrays are also shown on a black background and correspond to the partial discharge pulse arrays in the encircled area of the complete output partial discharge matrix 6. The partial discharge matrix 8 is, for presentation purposes, shown slightly expanded in the horizontal direction and the matrix arrays set as partial discharge pulse arrays can be seen individually in the form of a grid depiction. The partial discharge matrix 8 in FIG. 3 forms a grid of 17×20 arrays.

For the sake of brevity, the matrix arrays set as partial discharge pulse arrays are hereinafter referred to as "TIMs".

Figure 4A:
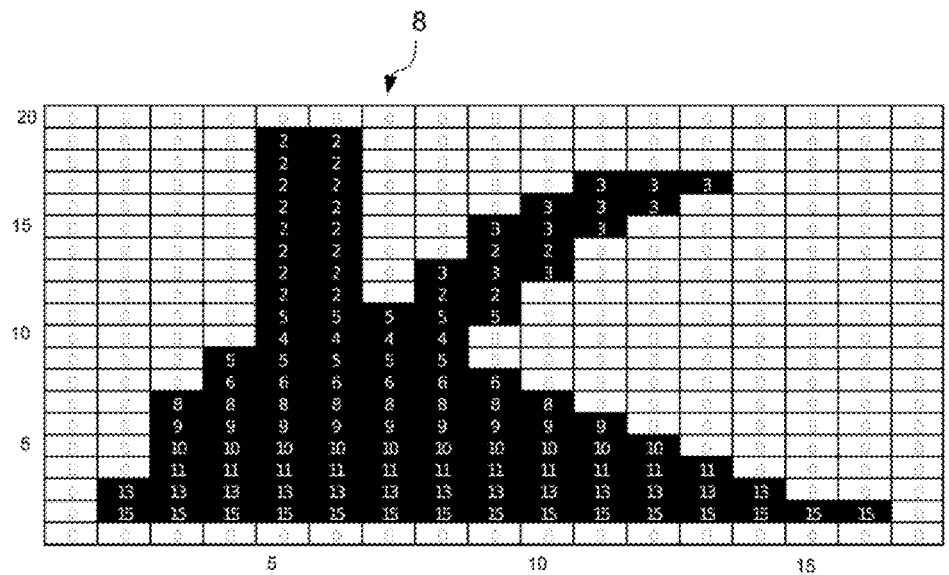
FIG. 4a shows the partial discharge matrix from FIG. 3 having its partial discharge pulse arrays labeled with the property value of the horizontal chain length.

FIG. 4a shows the partial discharge matrix 8 having its partial discharge pulse arrays labeled with the property value of the horizontal chain length.

According to FIG. 4a, the property: length of contiguous TIMs in the horizontal direction is allocated to each TIM.

Since the second row comprises 15 TIMs arranged next to one another, each of these TIMs is assigned the property value: length in the horizontal direction 15. The third row comprises 13 TIMs arranged next to one another, so each TIM is assigned the property value: length in the horizontal direction 13, etc.

The TIMs of the vertical bar starting at the tip of the triangle and the diagonal bar starting at the tip/of the triangle are separated from one another and are thus only assigned the property value of the TIMs arranged contiguously in the horizontal direction, namely 2 or 3 in rows 12 through 19.

Figure 4B:
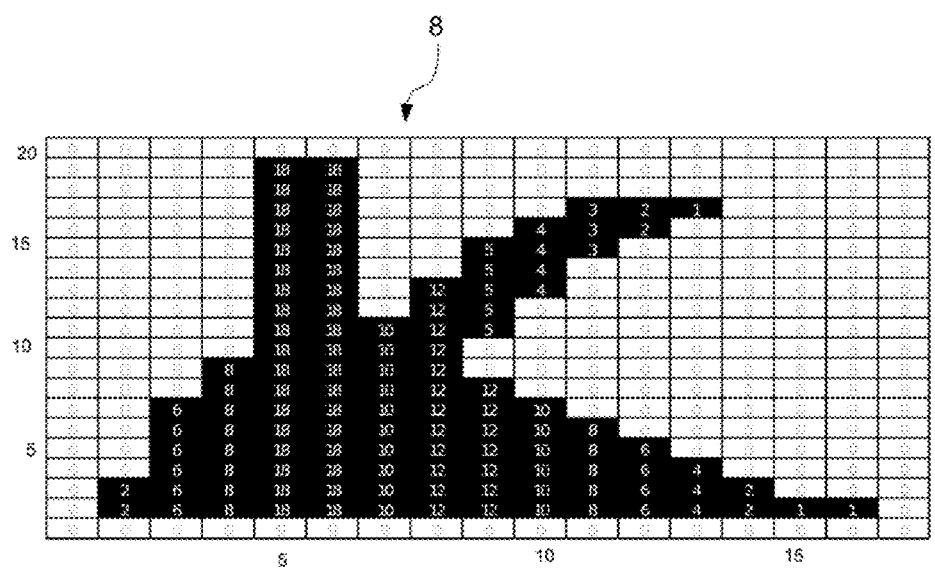
FIG. 4b shows the partial discharge matrix from FIG. 3 having its partial discharge pulse arrays labeled with the property value of the vertical chain length.

FIG. 4b shows the partial discharge matrix 8 having its partial discharge pulse arrays labeled with the property value of the vertical chain length.

Analogous to FIG. 4a, the property value: length of contiguous TIMs in the vertical direction is now allocated to each partial discharge pulse array. Since, in the second column, two TIMs are arranged on top of each other, each of these two TIMs is assigned the property value length in the vertical direction 2; in column 3, each partial discharge pulse array is assigned the property value length in the vertical direction 6, etc.

Figure 5A:
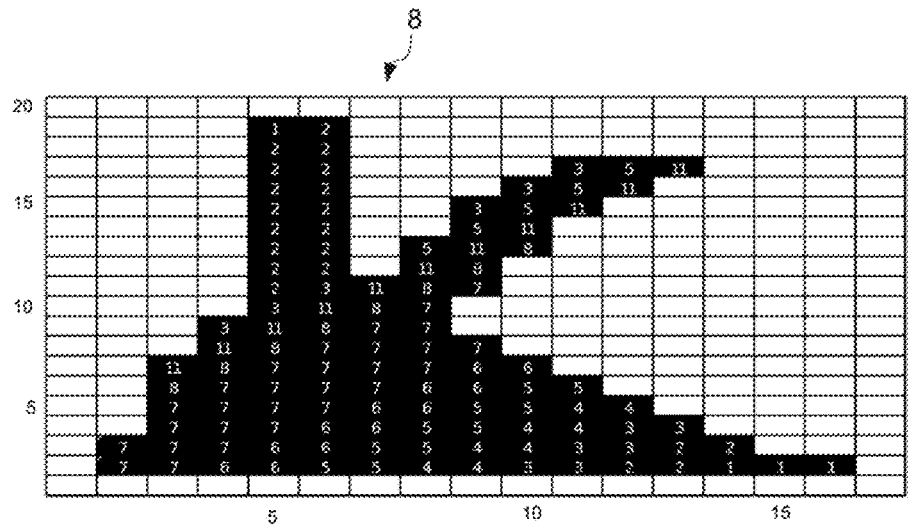
FIG. 5a shows the partial discharge matrix from FIG. 3 having its partial discharge pulse arrays labeled with the diagonally ascending chain length.

FIG. 5a shows the partial discharge matrix 8 having its partial discharge pulse arrays labeled with the property value of the diagonally ascending chain length.

According to FIG. 5a, each TIM is assigned the property length of the chain of contiguous TIMs in the diagonally ascending direction. For example, the TIM in column 5, row 19, is the only TIM in the diagonally ascending direction and is thus assigned the property value length in the diagonally ascending direction 1. The subjacent diagonal extending in the diagonally ascending direction comprises two TIMs, namely the TIM in column 5, row 18, and the TIM in column 6, row 19, both of which are assigned the property value length in the diagonally ascending direction 2.

Figure 5B:
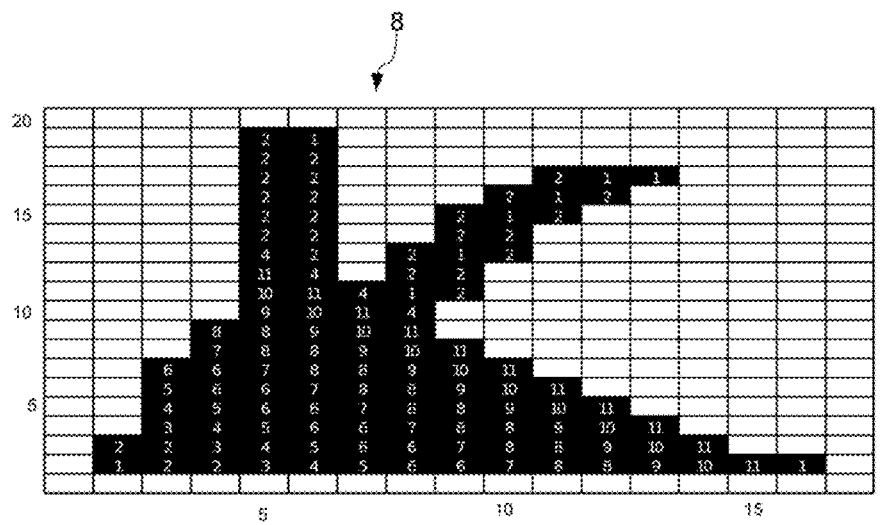
FIG. 5b shows the partial discharge matrix from FIG. 3 having its partial discharge pulse arrays labeled with the diagonally descending chain length.

FIG. 5b shows the partial discharge matrix 8 having its partial discharge pulse arrays labeled with the property value of the diagonally descending chain length.

According to FIG. 5b, the property length of the chain of contiguous points in the diagonally descending direction is allocated to each partial discharge array. In the TIM in column 2, row 2, this is the property value length in the diagonally descending direction 1, in the TIMs in column 2, row 3, and column 3, row 2, this is the property value length in the diagonally descending direction 2, etc.

Figure 6:
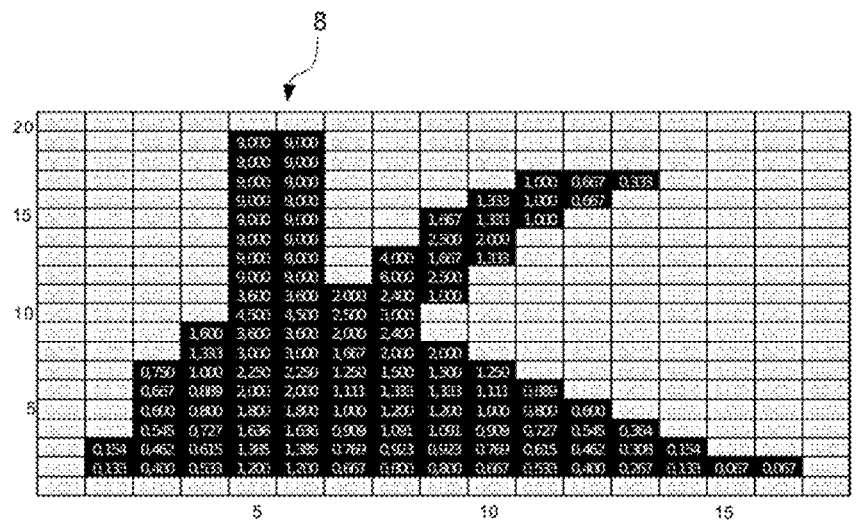
FIG. 6 shows the partial discharge matrix from FIG. 3 having its partial discharge pulse arrays labeled with the deduced property value of the cross aspect.

FIG. 6 shows the partial discharge matrix 8 having its partial discharge pulse arrays labeled with the deduced property value of the cross aspect.

According to FIG. 6, all TIMs are now assigned the deduced property value cross aspect, which results from the following formula:

$$\text{cross aspect} = \frac{\text{length of vertical point chain}}{\text{length of horizontal point chain}}$$

Consequently, the property value length of contiguous TIMs in the horizontal direction according to FIG. 4a is, for each TIM, divided by its property value length in the vertical direction according to FIG. 4b.

For the partial discharge array in column 2, row 2, the deduced property value cross aspect therefore results in 2: 15=0.133; for the TIM in column 2, row 3, the deduced property value cross aspect results in 2: 13=0.154, etc.

Figure 7:
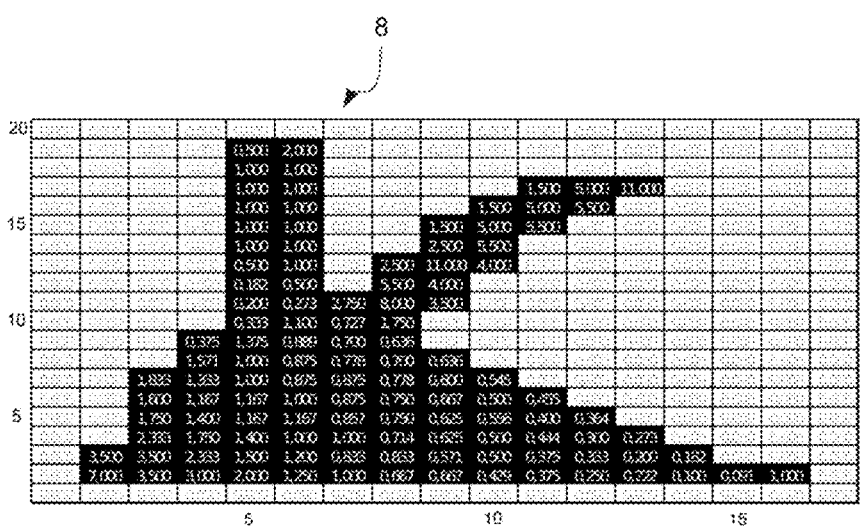
FIG. 7 shows the partial discharge matrix from FIG. 3 having its partial discharge pulse arrays labeled with the deduced property value of the diagonal aspect.

FIG. 7 shows the partial discharge matrix 8 having its partial discharge pulse arrays labeled with the deduced property value of the diagonal aspect.

According to FIG. 7, all TIMs are now assigned the deduced property value diagonal aspect, which results from the following formula:

$$\text{diagonal aspect} = \frac{\text{length of diagonally ascending point chain}}{\text{length of diagonally decending point chain}}$$

Consequently, the deduced property value diagonal aspect 5b is allocated to each TIM, said value resulting from its property value length in the diagonally ascending direction according to FIG. 5a divided by its property value length in the diagonally descending direction according to figure.

The deduced property value diagonal aspect for the TIM in column 2, row 2, thus results in 7: 1=7; for the TIM in column 2, row 3, the deduced property value diagonal aspect results in 7: 2=3.5; etc.

The deduced properties cross aspect and diagonal aspect are used to determine whether adjacent TIMs belong together or not.

To this end, the deduced properties cross deviation, diagonal deviation and deviation are allocated to the TIMs, sequentially TIM by TIM, and according to the following formulas:

$$\text{cross deviation} = \text{abs}\left(\frac{\text{minimum}\left(\begin{array}{c}\text{cross aspect point,}\\\text{cross aspect adjacent point}\end{array}\right)}{\text{maximum}\left(\begin{array}{c}\text{cross aspect point,}\\\text{cross aspect adjacent point}\end{array}\right)} - 1\right)$$

$$\text{diagonal deviation} = \text{abs}\left(\frac{\text{minimum}\left(\begin{array}{c}\text{diagonal aspect point,}\\\text{diagonal aspect adjacent point}\end{array}\right)}{\text{maximum}\left(\begin{array}{c}\text{diagonal aspect point,}\\\text{diagonal aspect adjacent point}\end{array}\right)} - 1\right)$$

$$\text{deviation} = \max(\text{cross deviation, diagonal deviation}).$$

This can be carried out in any arbitrary order. The present embodiment starts at the bottom left and then proceeds first row by row and then column by column.

Now, TIM by TIM, the horizontally, vertically or diagonally adjacent TIM, i.e. the adjacent TIM in the 3×3 environment with the greatest deviation, which is, however, still smaller than the maximum admissible deviation, is determined for each TIM. For this determination, the adjacent TIMs are considered sequentially TIM by TIM in a principally arbitrary order.

Figure 8:
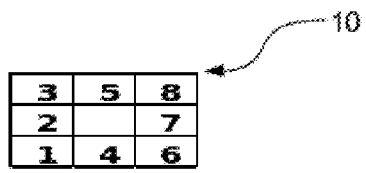
FIG. 8 shows a schematic view of a query sequence for each partial discharge pulse array.

FIG. 8 shows a schematic view of a query sequence 10 for each partial discharge pulse array.

The exemplary query sequence 10 starts with the TIM diagonally left beneath the considered TIM, proceeding from bottom to top and column by column to the right.

Figure 9:
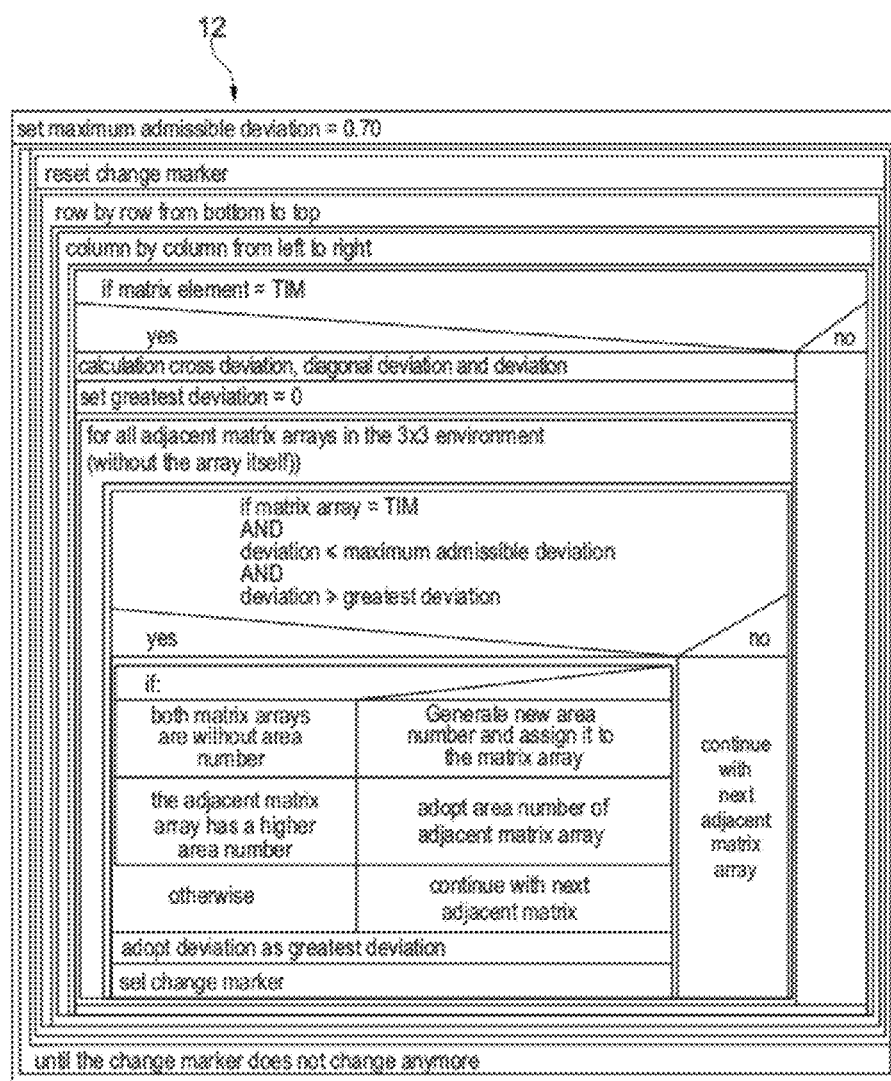
FIG. 9 shows a structogram of an iterative area allocation method for all partial discharge pulse arrays of the partial discharge matrix 6 or 8.

FIG. 9 shows a structogram of an iterative area allocation method 12 for all partial discharge pulse arrays of the partial discharge matrix.

The procedure according to the structogram is as follows.

First, a maximum admissible deviation is set to a predetermined value, which is 0.7 in the present embodiment; then a change marker is reset.

Then, the following routine is, for each TIM, carried out row by row from bottom to top and column by column from left to right. If the considered array is no TIM, the routine continues with the analysis of the next array.

Only in the event that the considered array is a TIM the following subroutine will be carried out.

First, the cross deviation, the diagonal deviation and the deviation are calculated for this TIM, in case this had not already been carried out before. Alternately, the cross deviation, the diagonal deviation and the deviation may have already been calculated beforehand in one run/for all TIMs.

Then, the value for the variable greatest deviation is set to zero.

Subsequently, all adjacent arrays in the 3×3 environment are considered sequentially for the considered TIM, following an arbitrary query sequence, preferably according to the query sequence 10 according to FIG. 8.

The routine checks 1. whether the adjacent array is a TIM, 2. whether the deviation of the adjacent TIM is smaller than the maximum admissible deviation, and 3. whether the deviation of the adjacent TIM is greater than or equal to the greatest deviation.

If one of these three conditions is not met, the routine continues with the next adjacent array.

If all three conditions are met, an area number is allocated to the considered TIM, or, if this TIM already has an area number, said area number is updated as follows.

If both TIMs do not have an area number yet, a new area number is allocated to the TIM. If the area number of the adjacent TIM is greater than the area number of the TIM, the area number of the adjacent TIM is allocated to the TIM. If neither one of these two conditions is met, the area number of the TIM is maintained.

This allocation rule is therefore as follows:

$$\text{area number} = \begin{cases} \text{new area number, both points without area number} \\ \text{area adjacent point, area number adjacent point >} \\ \text{current area number} \\ \text{current area number, in all other cases} \end{cases}$$

If, for an adjacent TIM, the deviation is greater than the thus far greatest deviation and still smaller than the admissible maximum deviation, the current deviation is adopted as the greatest deviation.

If the adjacent TIM does not yet have an area number itself, only the considered TIM itself is assigned a new area number. The adjacent TIM is only then assigned an area number if the TIM itself is compared to its adjacent TIM.

If, for one TIM, all adjacent TIMs have been handled and if the TIM has been assigned a new area number, or if the area number of the adjacent TIM has been adopted for the considered TIM, a change marker is set.

The routine then continues with the next TIM according to the order column by column from left to right and row by row from bottom to top.

This routine is carried out for all arrays of the partial discharge matrix.

After one complete run through all arrays of the partial discharge matrix, the routine checks whether the change marker has changed.

If so, the change marker is reset and the described routine is re-run through the complete partial discharge matrix.

This is repeated until after one complete run through the partial discharge matrix, the change marker remains unchanged, which indicates that there has been no other change in the allocation of the area numbers. At this point, the allocation of the TIMs to at least one closed area is completed.

One example run of the routine Iterative area allocation according to FIG. 9 is explained below with reference to FIGS. 10a through 13.

Figure 10A:
FIG. 10a shows a 4×6 partial matrix Diagonal aspect of the partial discharge matrix from FIG. 7 having its partial discharge pulse arrays labeled with the deduced property value of the diagonal aspect.

FIG. 10a shows a 4×6 partial matrix Diagonal aspect 14 of the partial discharge matrix 8 from FIG. 7 having its partial discharge pulse arrays labeled with the deduced property value of the diagonal aspect.

The partial matrix Diagonal aspect 14 is a 4×6 segment of the left lower area of the partial discharge matrix 8 according to FIG. 7 having its TIMs labeled with the deduced property diagonal aspect. The TIMs in row 2, columns 2 and 3, are highlighted by a bright background.

Figure 10B:
FIG. 10b shows a 4×6 partial matrix Cross aspect of the partial discharge matrix figure from FIG. 6 having its partial discharge pulse arrays labeled with the deduced property value of the cross aspect.

FIG. 10b shows a 4×6 partial matrix Cross aspect 16 of the partial discharge matrix from FIG. 6, having its partial discharge pulse arrays labeled with the deduced property value of the cross aspect.

The partial matrix Cross aspect 16 is a 4×6 segment of the left lower area of the partial discharge matrix 8 from FIG. 6, having its TIMs labeled with the deduced property cross aspect. The TIMs in row 2, columns 2 and 3, are highlighted by a brighter background.

For the purpose of explanation, the TIM in row 2, column 2 will now be considered.

Figure 11A:
FIG. 11a shows a calculation matrix Diagonal deviation of the partial discharge pulse array in row 2, column 2, from the adjacent partial discharge pulse arrays.

FIG. 11a shows a calculation matrix Diagonal deviation 18 of the partial discharge pulse array in row 2, column 2, from the adjacent partial discharge pulse arrays.

The calculation partial matrix Diagonal deviation 18 according to FIG. 11a is now a 3×3 segment of the left lower area of the partial discharge matrix 8 from FIG. 7 or the partial matrix diagonal aspect 14 from FIG. 10a, wherein the adjacent TIMs of the TIM in row 2, column 2, are labeled with the calculated deduced property diagonal deviation.

When applying the formula diagonal deviation to the adjacent TIM in row 3, column 2, the diagonal deviation results in abs(min. 7.000;3.500)/max(7.000;3.500)−1)=abs (3.500/7.000−1)=0.5.

This value for the diagonal deviation is allocated to the TIM in column 2, row 3, which is adjacent to the TIM in column 2, row 2.

Since the values for the diagonal deviation for the TIMs in column 3, row 2 and column 3, row 3, which is adjacent to the TIM in column 2, row 2, are also 3.500, the same value for the diagonal deviation 0.5 results for these adjacent TIMs.

Figure 11B:
FIG. 11b shows a calculation matrix Cross deviation of the partial discharge pulse array in row 2, column 2, from the adjacent partial discharge pulse arrays.

FIG. 11b shows a calculation matrix Cross deviation 20 of the partial discharge pulse array in row 2, column 2, from the adjacent partial discharge pulse arrays.

The calculation partial matrix Cross deviation 20 according to FIG. 11b is a 3×3 partial matrix which represents the segment of the lower area of the partial discharge matrix 8 from FIG. 6 or the calculation partial matrix Cross aspect 16 from FIG. 10b, respectively, having its TIMs labeled with the deduced property cross aspect.

Applying the formula cross deviation, the deduced property cross deviation is now calculated for the TIMs in column 2, row 3, in column 3, row 2, and in column 3, row 3, that are adjacent to the considered TIM in column 2, row 2, and said adjacent TIMs are assigned this deduced property cross deviation.

Applying the formula cross deviation to the adjacent TIM in column 2, row 3, the cross deviation results in abs(min(0.133,0.154)/max(0.133,0.154)−1)=abs ((0.133/0.154)−1)=0.136

For the adjacent TIM in column 3, row 2, the deduced property cross aspect, which is assigned to this TIM, results in abs(min(0.133,0.400)/max(0.133,0.400)−1)=abs ((0.133/0.400)−1)=0.668

For the adjacent TIM in column 3, row 3, the deduced property cross deviation which is assigned to this TIM analogously results in 0.452.

Figure 12:
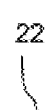
FIG. 12 shows a calculation matrix Deviation of the partial discharge pulse array in row 2, column 2, from the adjacent partial discharge pulse arrays.

FIG. 12 shows a calculation matrix deviation of the partial discharge array in row 2, column 2, from the adjacent partial discharge arrays.

The calculation matrix deviation 22 according to FIG. 12 forms a 3×3 partial matrix which represents the extract of the left lower area of the partial discharge matrix 8 from FIG. 6. The calculation matrix deviation 22 results from applying the formula deviation to the calculation partial matrix diagonal deviation 18 from FIG. 11a and to the calculation partial matrix cross deviation 20 from FIG. 11b.

According to the formula deviation, the maximum value from cross deviation and diagonal deviation, i.e. the greater of the two values of the same TIM from FIG. 11a and FIG. 11b, is now allocated to the TIMs in column 2, row 3, in column 3, row 2, and in column 3, row 3, that are adjacent to the considered TIM in column 2, row 2.

The deviation value for the adjacent TIM in column 2, row 3, is therefore max(0.500;0.136)=0.500 the deviation value for the adjacent TIM in column 3, row 2, is max(0.500;0.668)=0.668 and the deviation value for the adjacent TIM in column 3, row 3, is max(0.500;0.712)=0.712.

Figure 13A:
FIG. 13a shows a partial matrix Area number at the beginning of the partial discharge matrix from FIG. 3 having its partial discharge pulse arrays labeled with the area number they have at the beginning of the iterative area allocation method according to FIG. 9.

FIG. 13a shows a partial matrix area number at the beginning 24 of the partial discharge matrix 8 having its partial discharge pulse arrays labeled with their area number at the beginning of the iterative area allocation method according to FIG. 9.

The partial matrix area number at the beginning 24 according to FIG. 13a is a 4×7 partial matrix which represents a segment of the left lower area of the partial discharge matrix 8, the TIMs of which have not been allocated an area at the beginning of the iterative area allocation method according to FIG. 9, and the TIMs of which have been assigned the area number 0.

Figure 13B:
FIG. 13b shows a partial matrix after the allocation of the area number for a first partial discharge pulse array of the partial discharge matrix from FIG. 3, having its partial discharge pulse arrays labeled with the area number they have after a partial run of the iterative area allocation method according to FIG. 9.

FIG. 13b shows a partial matrix after area allocation 26 for the first partial discharge pulse array of the partial discharge matrix 8, the partial discharge pulse arrays of which were labeled with their area number after a partial run of the iterative area allocation method according to FIG. 9.

According to the partial matrix after area allocation 26, area number 1 has now been assigned to the TIM in column 2, row 2.

According to the application of the structogram iterative area allocation method 12, this was carried out as follows.

The maximum admissible deviation is first set to 0.7 and the change marker is reset.

Then, the first row of the partial discharge matrix 8 is first run through from left to right, wherein the check reveals for each array that the matrix array is not a TIM and thus always continues successively with the next array.

Subsequently, the second row of the partial discharge matrix 8 is run through from left to right. The check of the matrix array in the second row, first column, reveals that the matrix array is not a TIM and thus continues with the matrix array in the second row, second column.

For the matrix array in the second row, second column, the check reveals that this array is a TIM.

For this array and for the adjacent arrays, provided that they are TIMs, the deduced property values cross deviation, diagonal deviation and deviation are calculated. The thus required property values horizontal chain length, vertical chain length, diagonally ascending chain length, diagonally descending chain length, cross aspect and diagonal aspect were calculated before and appropriately buffered.

As an alternative, the deduced property values cross deviation, diagonal deviation and deviation may have been calculated for all TIMs prior to carrying out this iterative area allocation method.

The greatest deviation is now set to zero.

Next, the matrix arrays adjacent to the TIM in column 2, row 2, are analyzed according to the query sequence 10.

Since for the adjacent arrays in column 1, row 1, in column 1, row 2, in column 1, row 3, and in column 2, row 1, the condition adjacent array=TIM is not met, the next adjacent array is successively considered.

For the adjacent array in column 2, row 3, the check reveals that it is a TIM the deviation of which, 0.5, smaller than the maximum admissible deviation of 0.7 and greater than the greatest deviation, which was set to 0.

Since all three conditions are now met, it is checked whether the TIM in column 2, row 2 and the adjacent TIM in column 2, row 3, have still not been assigned an area number, which turns out to be the case. Accordingly, a new area number, in this case the next progressive area number 1, is generated, which is then assigned to the TIM in column 2, row 2, as depicted in the partial matrix Area number after the first allocation step 28.

If the TIM in column 2, row 3 had had a higher area number than the considered TIM in column 2, row 2, the TIM in column 2, row 2, would have been assigned the area number of the adjacent matrix array according to the command "Adopt the area sum of the adjacent array".

In the next step, the deviation 0.5 is adopted as the greatest deviation and a change marker is set. The check then continues with the next adjacent array.

This is the adjacent array in column 3, row 1, for which the condition adjacent array=TIM is not met, so the next adjacent array in column 3, row 2, is now considered.

The adjacent array in column 3, row 2, meets all three conditions, as this array is a TIM, its deviation of 0.668 is smaller than the maximum admissible deviation of 0.700 and is greater than the greatest deviation of 0.500. Accordingly, it is checked whether both arrays still have not been assigned an area number, which is not the case, as the TIM in column 2, row 2, has been set to the area number 1. Subsequently, it is checked whether the adjacent TIM in column 3, row 2, has a higher area number, which is not the case either, as it has a lower area number, namely 0, than the TIM in column 2, row 2.

Correspondingly, the check continues with the matrix array in column 3, row 3. This adjacent array is a TIM but does not meet the condition deviation smaller than or equal to the maximum admissible deviation, as the deviation value of 0.712 for this TIM is greater than the maximum admissible deviation of 0.70.

The consideration of all adjacent arrays for the TIM in column 2, row 2 thus yields the interim result of the area allocation for the TIMs, as depicted in the partial matrix after area allocation 26.

According to the structogram Iterative allocation method 12, the procedure now continues with the next TIM, which is, according to the routine row by row from bottom to top and column by column from left to right, the TIM in column 2, row 3.

The area allocation for this TIM and for all further TIMs is carried out by the method according to the structogram Iterative area allocation method 12 from FIG. 9 in analogy to the area allocation as described with reference to the TIM in column 2, row 2. Since a person skilled in the art can easily understand this, this is not further illustrated for space saving reasons.

Figure 14:
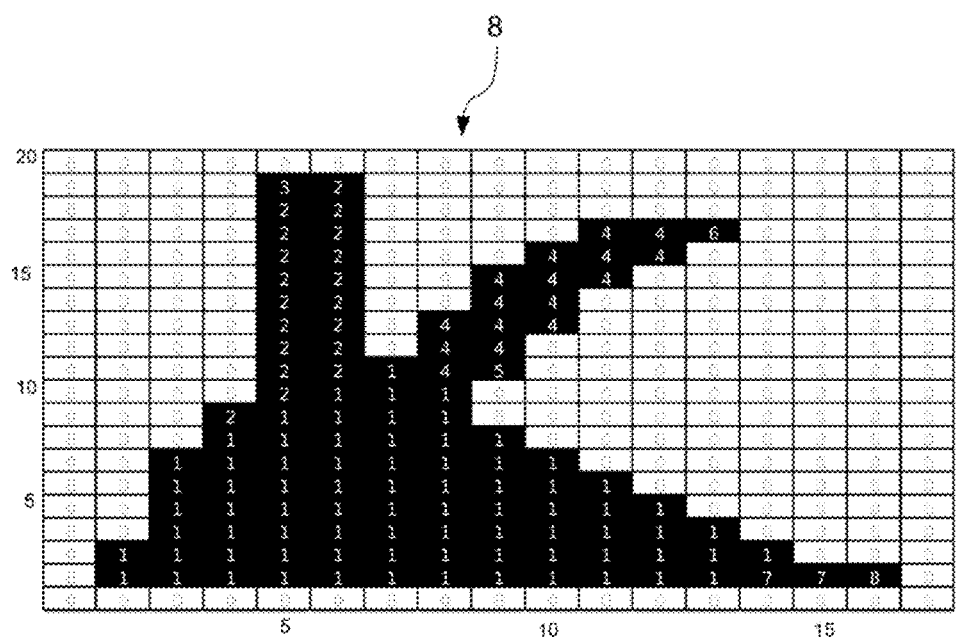
FIG. 14 shows the partial discharge matrix from FIG. 3, in which areas have been allocated to the TIMs by means of a complete run of the iterative area allocation method as described with reference to FIGS. 9 through 13b.

FIG. 14 shows the partial discharge matrix 8 in which areas have been allocated to the TIMs in a complete run of the iterative area allocation method, as described with reference to FIGS. 9 through 13.

As can be seen, eight different areas have been allocated altogether.

Area 1 consists of the TIMs in row 2, columns 2 through 13, the TIMs of rows 3, 4, 5, 6, 7 and 8, the TIMs of row 9, columns 5 through 8, the TIMs of row 10, columns 6 through 8, and the TIM of row 11, column 7.

Area 2 consists of the TIMs of row 9, column 4, the TIMs of column 5, rows 10 through 18 and the TIMs of column 6, rows 11 through 19.

Area 3 consists of the TIMs in row 19, column 5.

Area 4 consists of the TIMs of column 8, rows 11 through 13, column 9, rows 12 through 15, column 10, rows 13 through 16, column 11, rows 15 through 17, column 12, rows 16 through 17.

Area 5 consists of the TIM in row 11, column 9.

Area 6 consists of the TIMs in row 17, column 13.

Area 7 consists of the TIMs in row 2, column 14 and 15.
Area 8 consists of the TIMs in row 2, column 16.

For the continued consideration, those areas which consist of less than 10 TIMs and the extension of which does not exceed a value of 8, neither in the vertical nor in the horizontal direction, are removed in an optional removing step; these limiting values may of course also be chosen in a different manner. Such areas to be removed are considered insignificant.

According to FIG. 14, the areas considered insignificant are areas 5 through 8.

Figure 15A:
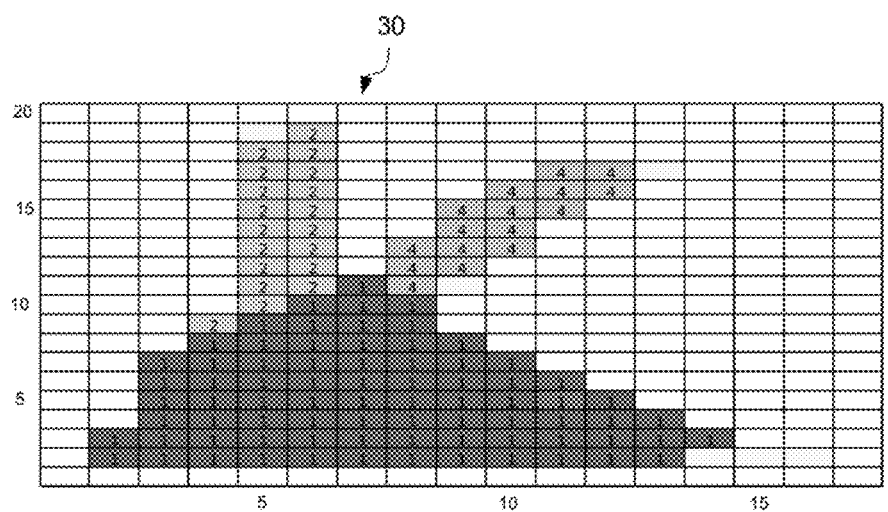
FIG. 15a shows the partial discharge matrix from FIG. 3 after the area allocation of the partial discharge pulse arrays and after removing those areas of partial discharge pulse arrays which are too small and thus considered insignificant.

FIG. 15a shows a partial discharge matrix 30 after the area allocation of the partial discharge pulse arrays and after removal of the areas of partial discharge pulse arrays that are too small and thus considered insignificant.

The partial discharge matrix 30 results from the partial discharge matrix 8 having its TIMs labeled with the numbers of the respective areas that have been allocated to these partial discharge pulse arrays after one complete run of the iterative area allocation method according to FIG. 9, and wherein those TIMs with a too small extension area have been removed.

As can be clearly seen, the TIMs have thus been arranged into three relevant areas, namely area 1, area 2 and area 4. Area 1 has—roughly speaking—the form of a triangle, area 2 has—roughly speaking—the form of a vertical bar extending from the tip of the triangle upwards, and area 4 has—roughly speaking—the form of a bar extending from the tip of the triangle upwards to the right.

Figure 15B:
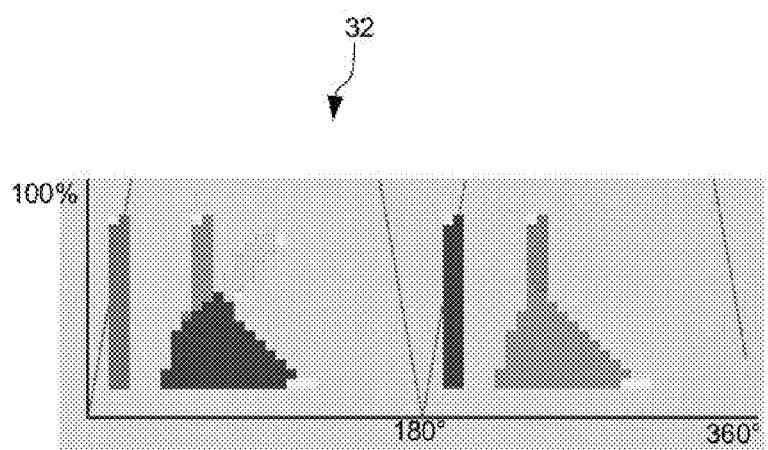
FIG. 15b shows the complete output partial discharge matrix from FIG. 2 after the partial discharge pulse arrays were allocated to different areas and after those areas of partial discharge pulse arrays which are too small and thus considered insignificant have been removed.

FIG. 15b shows a complete output partial discharge matrix 32, the partial discharge pulse arrays of which have been allocated to different areas, wherein the areas of partial discharge pulse arrays that are too small and thus considered insignificant have been removed.

After having explained the area allocation by way of example for the bordered area of the complete output partial discharge matrix 6, FIG. 15b now shows the complete output partial discharge matrix 6 after the area allocation has been completed. The identified contiguous areas are shown on a colored background.

It can be clearly seen in FIG. 15b that the vertical bars at phase positions 20° and 200° have been identified as respective contiguous areas, the basic triangles of the set of TIMs at phase positions from 40 to 120° and 220 to 300° as respective contiguous areas, the vertical bars extending at phase positions from 60° to 70° and 240° to 250° from the tip of the triangles upwards as respective contiguous areas, and the bar extending from the tip of the left triangle diagonally upwards at phase position from 80 to 100° as a contiguous area.

These too small areas according to FIG. 15a are shown in FIG. 15b on a bright background.

Figure 16A:
FIG. 16a shows a schematic view of the basic form Spot.
Figure 16B:
FIG. 16b shows a schematic view of the basic form Hill.
Figure 16C:
FIG. 16c shows a schematic view of the basic form Flame.
Figure 16D:
FIG. 16d shows a schematic view of the basic form Tower.
Figure 16E:
FIG. 16e shows a schematic view of the basic form Sickle.
Figure 16F:
FIG. 16f shows a schematic view of the basic form Fin.
Figure 16G:
FIG. 16g shows a schematic view of the basic form Platform.

FIG. 16a shows a schematic view of the basic form Spot 34; FIG. 16b shows a schematic view of the basic form Hill 36; FIG. 16c shows a schematic view of the basic form Flame 38, FIG. 16d a schematic view of the basic form Tower 40; FIG. 16e a schematic view of the basic form Sickle 42; FIG. 16f a schematic view of the basic form Fin 44; and FIG. 16g a schematic view of the basic form Platform 46.

FIGS. 16a through 16g show and describe characteristic basic forms of TIMs. These basic forms can be mathematically described by means of criteria inter-linked by operators, which must be met in combination with one another.

This is based on specific basic forms, which are not exhaustively listed in the following:

Area Share: Number of TIMs/number of all matrix elements of the enveloping rectangle;
Aspect of the enveloping rectangle: vertical extension/horizontal extension;
Free Corners: Determination in how many corners of the enveloping rectangle all cells are free;
Free Sides: Determination in how many side centers of the enveloping rectangle all cells are free;
Curvature:
Left turn=$\min_y x$;
Top turn=$\max_y x$;
Right turn=$\max_x y$;
Bottom turn=$\min_y x$
Symmetry:
V-Sym: Symmetry about vertical center axis
H-Sym: Symmetry about horizontal center axis The basic form Spot 34 is defined by the following combination of conditions:

Spot:=AreaShare>=0.78&&
(FreeCorners>=3||FreeCorners<=1)&& FreeSides<=0&& Aspect<2&& Aspect>0.5

In this formula and in all following formulas, the operator || describes an OR-operation.

The basic form Hill 36 is defined by the combination of the following conditions:

Hill:=AreaShare==0.64&& FreeCorners==2&&
(FreeSides==2||FreeSides==0)&&

Aspect>=0.25&& Aspect<=4&& LeftTurn>0&&
(RightTurn<0||V-Sym==1)&& BottomTurn>=0&& H-Sym !=1

The basic form Flame 38 is defined by the combination of the following conditions:

Flame:=AreaShare<=0.40&& Aspect>=1.0&&
FreeCorners<=2&& FreeSides>=2&& FreeSides<=3&& BottomTurn==0&& LeftTurn<0&&
RightTurn>0

The basic form Tower 40 is defined by the combination of the following conditions:

Tower:=AreaShare>=0.78&& Aspect>=3&& LeftTurn>=0&& RightTurn<=0

The basic form Sickle 42 is defined by the combination of the following conditions:

Sickle:=AreaShare<=0.35&& FreeCorners==2&&
FreeSides>=3&& LeftTurn>0&& RightTurn>0&& BottomTurn>0&& TopTurn<0

The basic form Fin 44 is defined by the combination of the following conditions:

Fin:=AreaShare==0.50&& Aspect<3&&
Aspect>0.33&& FreeCorners<=2&& FreeSides>=1&& FreeSides<=3&& BottomTurn>=0&& LeftTurn>=0&&(RightTurn>=0||V-Sym<=0.75)

The basic form Platform 46 is defined by the combination of the following conditions:

Platform:=AreaShare==0.78&& Aspect<0.25&&
BottomTurn>=0&& TopTurn<=0&&
H-Sym==1.

FIGS. 16a through 16g provide examples of some basic forms. The illustration is not exhaustive; many other forms may also be used.

Another possibility would be, for example, the basic form Arch, which is defined by the combination of the following conditions:

Arch:=AreaShare<=0.50&& FreeCorners>=2&&
FreeCorners<=3&&(FreeSides-1||FreeSides==3)
&& BottomTurn<0.

Examples of calculating the free corners, the free sides, the curvature and the symmetry are given below with reference to FIGS. 17 through 20. The calculation examples in FIGS. 17 through 20 do, for the sake of simplicity, not refer to an area according to the partial discharge matrix with area allocation 30 from FIG. 15a, but rather are simpler.

Figures 17A, 17B, 18:
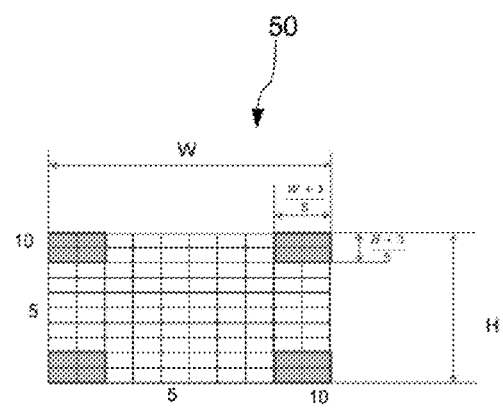
FIG. 17a shows an exemplary calculation matrix for calculating the curvature on top and to the right of an envelope.
FIG. 17b shows an exemplary calculation matrix for calculating the curvature on the bottom and to the left of an envelope.
FIG. 18 shows a calculation matrix for calculating the free corners of an enveloping rectangle.

FIG. 17a shows an exemplary calculation matrix 48 for calculating the curvature on top of and to the right of an envelope.

The calculation matrix Envelope 48 used in FIG. 17a and the calculation matrix Envelope 49 used in FIG. 17b are examples based on a group of contiguous TIMs, as determined according to the iterative area allocation method described above. This group of TIMs is represented in a 6×5 matrix.

The index of the highest occupied row of a column (greatest TIM) is shown in the subjacent row ymax[n]. Since in FIG. 17, the topmost TIM in the first column is in row "0", ymax[n] is assigned the value 0 for the first column; since the upmost TIM in the second column is in row "2", y[n] is assigned the value 2 for the second column, etc.

In row −2ymax[n], the values of the superjacent ymax [n] have each been multiplied by the factor −2.

In row ymax[n−2], the value of the box located two boxes to the left is entered for ymax [n−2]. Since in column 0 and in column 1 the box two boxes to the left has no value, these boxes are not assigned a value, or rather the value 0. Since in column 2 the box two boxes to the left has the value 0, this box is assigned the value 0; since, in column 3, the box ymax[n] two boxes to the left has the value 2, this box is assigned the value 2, etc.

In row ymax[n+2], the value for the box located two boxes to the right is entered for ymax[n+2]. Since in column 0, the box ymax[n] two boxes to the right has the value 4, this box is assigned the value 4; since in column 1, the box ymax[n] two boxes to the right has the value 3, this box is assigned the value 3, etc.

Analogously, the index of the highest occupied column of a row is represented in the column nmax[y] adjacently to the right. Since in the first row, the rightmost TIM in the column is 2, nmax[y] is assigned the value 2, since in the second row, the rightmost TIM in the column is 3, nmax[y] is assigned the value 3, etc.

The values resulting from a multiplication of the values in the column nmax[y] with the factor −2 are entered into column −2nmax[y].

The values in the two subjacent boxes are respectively entered into column nmax[y−2]. In the first column, the column nmax[y−2] has the value 4, since the column nmax[y] two boxes below has the value 4, etc.

The values in the two respective superjacent boxes are entered into the column nmax[y+2].

The curvature values can now be calculated by means of the following formulas:

$$\text{Curvature top} = \sum_{i=2}^{n_{max}-2} y_{max}[i+2] - 2 * y_{max}[i] + y_{max}[i-2]$$

$$\text{Curvature bottom} = \sum_{i=2}^{n_{max}-2} y_{min}[i+2] - 2 * y_{min}[i] + y_{min}[i-2]$$

$$\text{Curvature right} = \sum_{i=2}^{y_{max}-2} n_{max}[i+2] - 2 * n_{max}[i] + n_{max}[i-2]$$

$$\text{Curvature left} = \sum_{i=2}^{y_{max}-2} n_{min}[i+2] - 2 * n_{min}[i] + n_{min}[i-2]$$

In FIG. 17a, by way of example, the upper curvature value was, using the formula upper curvature, calculated as "−10" and the right curvature value was, using the formula upper curvature, calculated as "−1".

FIG. 17b uses calculation matrix 49 as an example for calculating the curvature on the bottom and to the left of an envelope.

The index of the lowest occupied row of a column (smallest TIM) is represented in the subjacent row ymin[n]. In row −2ymin[n], the values of the superjacent row ymin[n] were each multiplied by the factor −2. In row ymin[n−2], the value of the box two boxes to the left is entered for ymin[n−2]. In row ymin[n+2], the value of the box ymin [n+2] two boxes to the right is entered.

Analogously, the index of the lowest occupied column of a row is represented in the right adjacent column nmin[y]. The values resulting from a multiplication of the values in column nmin[y] by the factor −2 are entered into row ymin[n+2]. The values in the box two boxes below are entered into row ymin[n+2]. The values in the box two boxes above are entered into column nmin[y+2].

According to FIG. 17b, the curvature value on the bottom therefore was, using the formula curvature on the bottom, calculated as "0" and the curvature value left was, using the formula curvature left, also calculated as "0".

On the basis of the information provided above, a person skilled in the art can easily calculate this.

FIG. 18 shows a calculation matrix 50 for calculating the free corners.

Figures 19, 20:
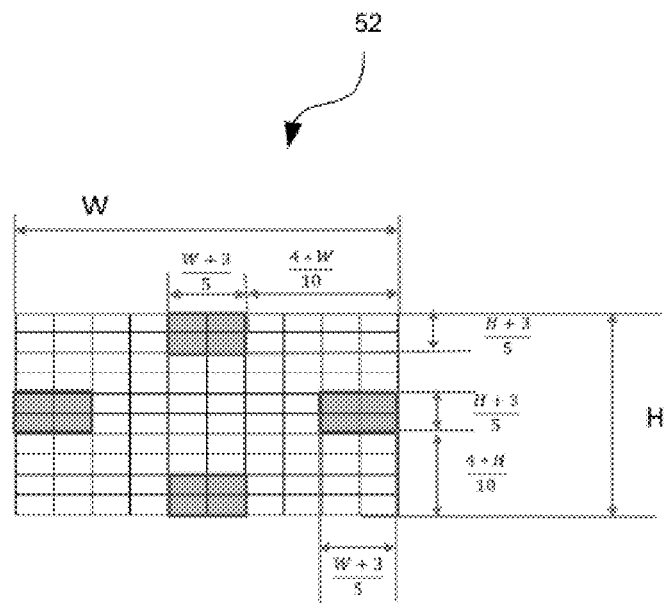
FIG. 19 shows a calculation matrix for calculating free side centers of an enveloping rectangle.
FIG. 20 shows a calculation matrix for calculating the horizontal and vertical symmetries.

FIGS. 18 and 19 show exemplary envelope rectangles of a height H and a width W, wherein, for the sake of simplicity, none of the matrix arrays are shown as a set TIM. It is assumed that each of these enveloping rectangles W×H comprises a group of TIMs, which were previously determined according to the iterative area allocation method. An enveloping rectangle envelops a group of TIMs and is as small as possible, while containing all TIMs of this group. Accordingly, at least one TIM is located in the leftmost column, at least one TIM in the rightmost column, at least one TIM in the bottom row and at least one TIM in the top row of the enveloping rectangle.

According to the calculation matrix FreeCorners 50, the corner regions of the enveloping rectangle having a height H and a width W are considered. In the present case, the corner regions have a height (H+3)/5 and a width (W+3)/5, with the result being truncated. The dimensions of the free corners may of course also be determined in a different manner.

If each of the corner regions has at least one TIM located therein, and is thus not free, the formula FreeCorners gets the value zero; if three corner areas have at least one TIM located therein, however one corner region is without a TIM, the formula Free Corners gets the value 1, etc.

FIG. 19 shows a calculation matrix 52 for calculating free sides of an enveloping rectangle.

According to the calculation matrix FreeSides 52, side centers are considered those TIMs which are in a range of height (H+3)/5 and width (W+3)/5, the side edge of which is spaced apart from the side edge of the enveloping rectangle by the value (4×W)/10 (for the side center of the transverse sides) and the lower edge of which is spaced apart from the lower edge of the enveloping rectangle by the value (4×h)/10 (for the side centers of the transverse sides). The dimensions of the side centers may of course also be determined in a different manner.

If all four of these side center regions each have at least one TIM located therein, the formula FreeSides gets the value zero; if three sides each have at least one TIM located therein, however one side is without a TIM, the formula FreeSides gets the value 1, etc.

FIG. 20 shows a calculation matrix 54 for calculating symmetry.

FIG. 20 shows, by way of example, a group of TIMs in the form of a calculation matrix Symmetry 54, which was previously determined by means of the iterative area allocation method.

FIG. 20 does not show an actual area of the partial discharge matrix 8, but rather a randomly generated matrix, which was created for the sake of explaining the calculation principle in a simple manner and thus comprises advantageously occupied matrix elements. The "ones" are not area numbers, but rather identifiers of whether or not a matrix element is occupied ("one"), and thus a TIM, or not ("zero").

The enveloping rectangle is a 6×4 partial matrix, and those matrix arrays which were set as TIMs are labeled with 1, whereas those matrix arrays which were not set as TIMs are labeled with 0.

Now the procedure runs row by row and determines a deviation value for each row, which is, in FIG. 20, for example, entered into an additional column on the far right, and correspondingly runs column by column and determines a deviation value for each row, which is, for example, entered into an additional row on the far bottom in FIG. 20.

Those matrix arrays in which horizontal symmetry, i.e. in case of a reflection about the vertical axis extending between the third and the fourth column, yields a deviation are shown on a gray background.

Those matrix arrays in which vertical symmetry, i.e. in case of a reflection about the horizontal axis between the second and the third row, yields a deviation are indicated by italics and an underlined matrix value.

The deviation is thus obtained according to the following conditions:

The conditions for label "gray" or italics result from the following formulas:

gray =
$$\begin{cases} \text{yes}, f[-\text{column index}][\text{row index}] == f[\text{column index}][\text{row index}] \\ \text{no}, f[-\text{column index}][\text{row index}] != = f[\text{column index}][\text{row index}] \end{cases}$$

italics =
$$\begin{cases} \text{yes}, f[\text{column index}][\text{row index}] == f[\text{column index}][\text{row index}] \\ \text{no}, f[\text{column index}][\text{row index}] != = f[\text{column index}][\text{row index}] \end{cases}$$

A matrix element is therefore "gray" if it has the same value as its reflection element about the vertical center (reflection) axis. It is thus "italic" if it has the same value as its reflection element about the horizontal center (reflection) axis.

Applied to the considered partial matrix, the symmetries HSYM and VSYM are then:

HSym=set of ITALIC matrix elements/set of all matrix elements and

VSym=set of GREY matrix elements/set of all matrix elements.

In order to calculate HYSM and VSYM for an actual area, only those matrix elements are labeled "gray" or "italic" and counted which belong to the area under consideration. The set of all matrix elements corresponds to the set of the matrix elements of the enveloping rectangle.

In the bottom row Column Index, the index of the respective columns is entered, which is, for the three left columns −3, −2 and −1, and for the right three columns 1, 2 and 3, and in the right column Row Index, the index of the respective rows is entered, which is −2 and −1 for the lower two rows and 1 and 2 for the upper two rows.

In the row Column Set Italic Values, the set of the italic matrix elements is entered into this column and in the column Row Set Gray Cells, the set of the gray matrix elements is entered into the respective line. The set of cursive matrix elements results from a summation of all values in the row Column Set Italic Values and the set of all gray matrix elements results from a summation of all values in the column Row Set Gray Cells.

In the present embodiment, the application of the formulas for HSYM and VSYM results in the value 0.58 for the horizontal symmetry and the value 0.25 for the vertical symmetry.

Figures 21, 22, 23:
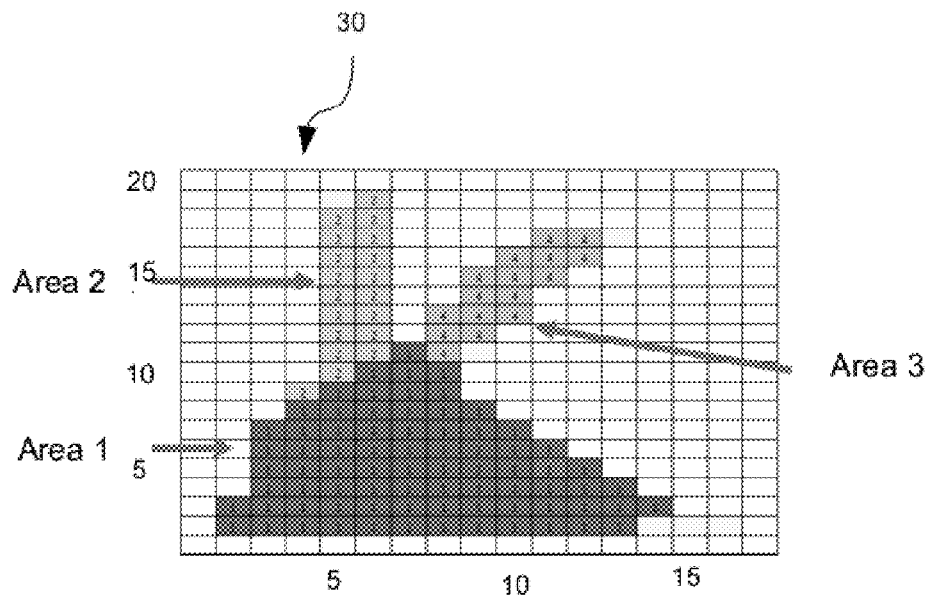
FIG. 21 shows the partial discharge matrix with area allocation from FIG. 15a having the ascertained and subsequently examined areas labeled separately.
FIG. 22 shows a table having the actual values for the area parameters entered thereinto for the three examined areas.
FIG. 23 shows a form allocation table for the examined areas.

FIG. 21 shows the partial discharge matrix with area allocation 30 of FIG. 15*a* having the ascertained and subsequently analyzed areas shown separately therein.

The illustration in FIG. 21 corresponds to the representation of the partial discharge matrix with area allocation 30 of FIG. 15*a*, wherein, for the sake of clarity, the three identified groups of TIMs are labeled separately, namely the TIMs of group 1 as area 1, the TIMs of group 2 as area 2, and the TIMs of group 4 as area 3.

These areas are now subjected to form recognition. The forms are substantially identified by means of the analysis of the respective area share. According to the following rule sets, the location of free areas is checked, i.e. areas in which no TIMs have been set, the location of occupied areas is checked, i.e. areas having TIMs therein, and it is also checked what conditions and symmetries occur. Characteristic basic forms are dominated by certain parameters; therefore, only the actually necessary parameters are used for the characteristic basic forms.

FIG. 22 shows a table 56 having the actual values for the area parameters for the three analyzed areas entered therein.

Now the area parameters AreaShare, Aspect, FreeCorners, FreeSides, LeftTurn, TopTurn, RightTurn, BottomTurn, H-Sym and V-Sym are calculated for each of the areas 1, 2 and 3.

The principle of this calculation was explained above in such detail that a person skilled in the art can readily understand this on the basis of the information provided.

These area parameters are entered into the table Actual Values Area Parameters according to FIG. 22.

These area parameters are now, for each enclosed area, compared to predefined rule sets in order to allocate one or more conform basic forms to each area. To this end, the existing rule sets are applied to each area, thus determining the probability of conformity of each area with each of the existing rule sets.

Each rule set may be composed of one or more sub-rules which are inter-linked by logic operators or, if applicable, brackets.

A sub-rule is the comparison of a single area parameter, as contained in table 56, (actual value) with a target (target value). The result of a sub-rule is assigned to a form, wherein there may be several rule sets for one form.

As comparison, at least the following characters are available:

"=" or "!="

"=" represents the check for equality, "!=" represents the check for inequality. Mathematically, "value inequality"=1−"value equality" (equality is calculated according to the corresponding formula F1 below)

">" or "<"

combination of "=" and ">" or "<"

The comparisons may be carried out by mapping continuous functions. For this purpose, the Gaussian function, on the one hand, $$F1 := e^{-\ln(tolerance\ value)} \left(\frac{actual\ value - target\ value}{tolerance\ width}\right)^2$$

and the inverse tangent functions, on the other, $$F2 := 0.5 + \frac{\arctan(normalization * (tolerance\ width - distance))}{\pi}$$

and $$F3 := 0.5 - \frac{\arctan(normalization * (tolerance\ width + distance))}{\pi}$$

with $$normalization = \frac{\tan(\pi * (tolerance\ value - 0.5))}{tolerance\ width}$$

and $$distance = actual\ value - target\ value$$

are applied as follows:

"=":

with q=F1 and the variables:
 Actual value=property value of the form to be determined
 Target value=value of the property of the reference form
 Tolerance width=0.45
 Tolerance value=50%

"!=":

with q=1−F1 and the variables:
 Actual value=property value of the form to be determined
 Target value=value of the property of the reference form
 Tolerance width=0.45
 Tolerance value=50%

">":

with q=F2 and the variables:
 Actual value=property value of the form to be determined
 Target value=value of the property of the reference form
 Tolerance width=0.15
 Tolerance value=15%

"<":

with q=F3 and the variables:
 Actual value=property value of the form to be determined
 Target value=value of the property of the reference form
 Tolerance width=0.15
 Tolerance value=15%

"<=":

with $$q = \begin{cases} F1, & actual\ value > target\ value \\ 1, & actual\ value \leq target\ value \end{cases}$$

and the variables
 Actual value=property value of the form to be determined
 Target value=value of the property of the reference form
 Tolerance width=0.45
 Tolerance value=50%

">=":

with $$q = \begin{cases} F1, & actual\ value > target\ value \\ 1, & actual\ value \leq target\ value \end{cases}$$

and the variables
 Actual value=property value of the form to be determined
 Target value=value of the property of the reference form
 Tolerance width=0.45
 Tolerance value=50%

Operations may be carried out as follows.

"AND"-operation by means of geometric averaging $$F4 := \sqrt[G]{Value\ 1 * Value\ 2}$$

with $G$=weight1+weight2

"OR"-operation by means of selection of "maximum" value $$F5 = \begin{cases} value\ 1\ /\ weight\ 1, & value\ 1 \geq value\ 2 \\ value\ 2\ /\ weight\ 2, & value\ 1 < value\ 2 \end{cases}$$

The commutative law applies.

A person skilled in the art is readily able to apply these comparison functions and operations on the basis of the information provided herein.

FIG. 23 shows a form allocation table 58 for the analyzed areas.

According to the form allocation table 58, a 45% conformity with the rule set Sickle, a 99% conformity with the rule set Fin and a 31% conformity with the rule set Tower was ascertained for area 1. For area 2, a 22% conformity with the rule set Sickle, a 44% conformity with the rule set Fin and an 85% conformity with the rule set Tower was ascertained. For area 3, a 75% conformity with the rule set Sickle, a 67% conformity with the rule set Fin and a 0% conformity with the rule set Tower was ascertained.

Figure 24A:
FIG. 24a shows a table for determining the probability value of the conformity of area 1 with the rule set Sickle.
Figure 24B:
FIG. 24b shows a table for calculating the probability value of the conformity of area 1 with the rule set Fin.
Figure 24C:
FIG. 24c shows a table for calculating the probability value of the conformity of area 1 with the rule set Tower.

FIG. 24A shows a table 60 for determining the probability value of conformity of area 1 with the rule set Sickle;

FIG. 24B shows a table 62 for calculating the probability value of conformity of area 1 with the rule set Fin, and FIG. 24C shows a table 64 for calculating the probability value of the conformity of area 1 with the rule set Tower.

The application of the rule sets Sickle, Fin and Tower to area 1, i.e. the calculation of the probability values 45% conformity with the rule set Sickle, 99% conformity with the rule set Fin and 31% conformity with the rule set Tower, is described below by way of example.

The procedure for calculating the probability value of the conformity of area 1 with the rule set Sickle is shown in the following.

The procedure determines the probability values for the conformity of the actual values area share, free corners, free sides, curvature left, curvature right, curvature right and curvature on top with the target values of the respective rule set, as entered in FIG. 24A.

This leads to the result:

$$\text{Result} = \sqrt[7]{82\% * 100\% * 3\% * 99\% * 100\% * 15\% * 97\%} = 45\%$$

This corresponds to a 45% probability of the conformity of area 1 with the rule set Sickle. This resulting value is entered into the form allocation table 58 for area 1.

The partial results are obtained by applying the rule and the corresponding formula for the comparison with the respective actual values and target values.

The result for area share was, for example, determined to be 82%. Inserting the target value (35%) and the actual value (59.2%) into formula F1 (F1 because actual value>target value) to be applied for calculating "<=", yields 82% (see row 1 "AreaShare" in the table above).

The same procedure is applied to the other rows. The results in the last column in FIG. 24A are now averaged. To this end, the seventh root (because the sum of the weights of the seven comparisons is 7) is extracted from the product result and entered into table 58 in FIG. 23 as probability. This principle of multiplying/extracting roots is generally also known as geometric averaging.

The calculation of the probability value of the conformity of area 1 with the rule set Fin is carried out as follows.

The probability values for the conformity of the actual values area share, aspect ratio, free corners, free sides, curvature bottom, curvature left, curvature right and curvature top with the corresponding target values of the rule set Fin as entered in FIG. 24B are determined:

This results in:

$$\text{Result} = \sqrt[7]{97\% * 95\%\ 2*100\% * 100\%\ 2*100\% * 100\% * 100\%} = 99\%$$

This corresponds to a 99% probability of conformity of area 1 with the rule set Fin. This resulting value is entered into the form allocation table 58 for area 1.

The calculation of the probability value of the conformity of area 1 with the rule set Tower is carried out as follows.

The probability values for the conformity of the actual values area share, aspect ratio, curvature left and curvature right with the corresponding target values of the rule set Tower as entered in FIG. 24C are determined.

This results in:

$$\text{Result} = \sqrt[4]{89\% * 1\% * 100\% * 100\%} = 31\%$$

This corresponds to a 31% probability of conformity of area 1 with the rule set Tower. This resulting value is entered in the form allocation table 58 for area 1.

For the other areas 2 and 3, the calculation of the probability of the conformity of these areas with the rule sets Sickle, Fin and Tower is carried out analogously.

Now each area is allocated to the form yielding the best result, i.e. the greatest conformity in percent. Accordingly, the basic form Fin is allocated to area 1, the basic form Tower to area 2, and the basic form Sickle to area 3.

Figure 25:
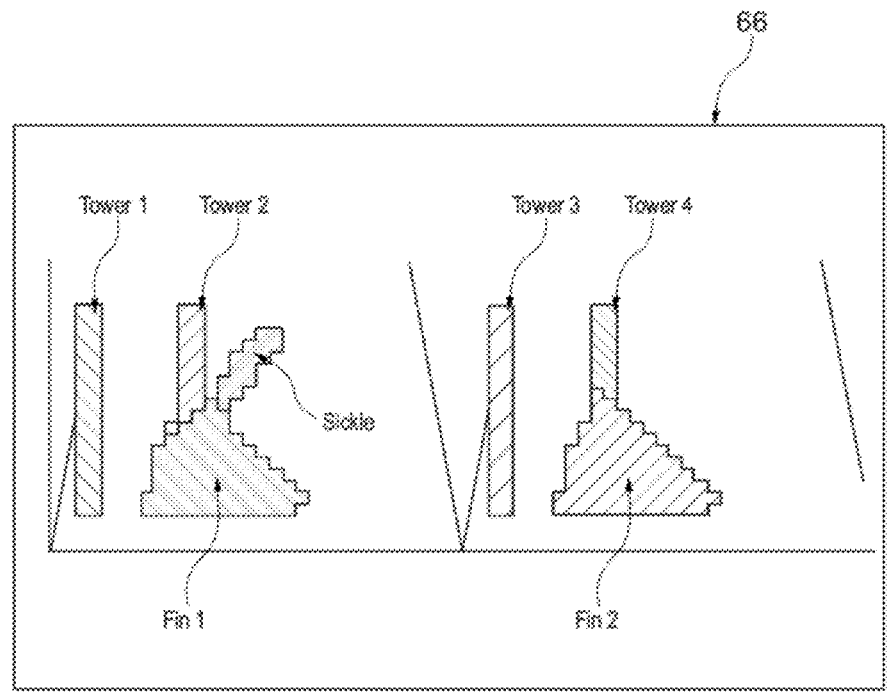
FIG. 25 shows the complete output partial discharge matrix from FIG. 15b, the areas of which have been allocated to forms.

FIG. 25 shows the complete output partial discharge matrix 66 with area allocation.

According to the complete output partial discharge matrix with area allocation 66, the basic form Tower was allocated to the groups of TIMs with a vertical bar form at phase 20°, 60°, 200° and 240°, respectively. These groups of TIMs in FIG. 25 are referred to as Tower 1 through Tower 4.

The basic form Fin was allocated to the group of TIMs of phase 50 through 120° and 230 through 300°, respectively, which roughly speaking have the basic form of a triangle. These groups of TIMs are referred to as Fin 1 and Fin 2 in FIG. 25.

The basic form Sickle was allocated to the group of TIMs extending, at a phase of 80 to 100°, from the top of the basic form Fin 1 diagonally upwards to the right, and this group of TIMs is referred to as sickle in FIG. 25.

Figure 26:
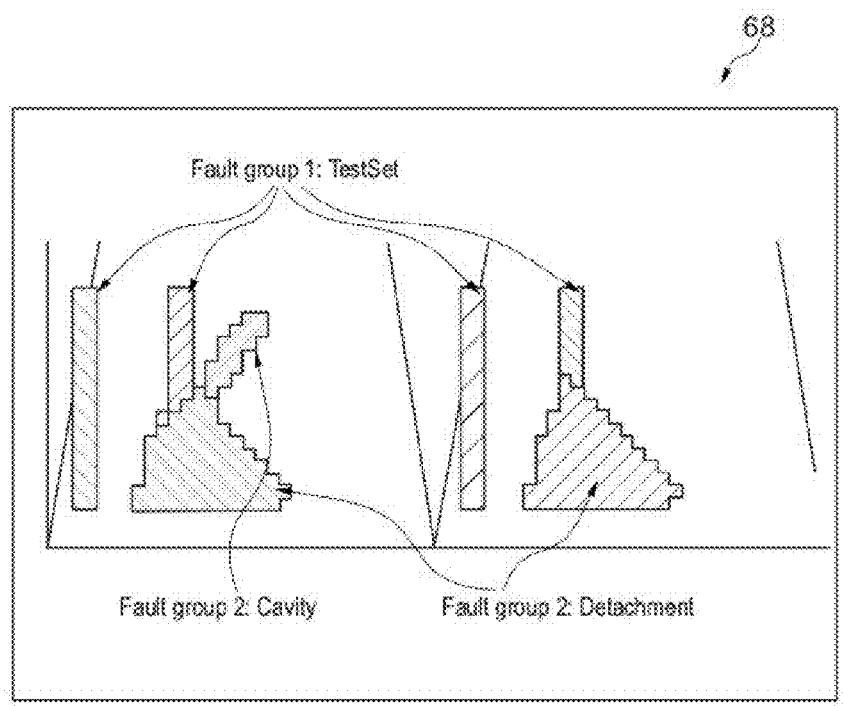
FIG. 26 shows the complete output partial discharge matrix from FIG. 15b, the ascertained areas of which have been allocated to respective causal partial discharge sources.

FIG. 26 shows the complete output partial discharge matrix 68 with the allocation of the respective causal partial discharge sources to areas.

The basic forms identified and described in FIG. 25 are now allocated to known partial discharge sources using known fault rules, which allocate characteristic partial discharge pulse area basic forms and characteristic combinations of partial discharge pulse basic forms to known partial discharge sources.

According to one fault rule, enclosed areas that have the same basic form and are shifted by 180° with respect to one another are allocated to one another according to the following formula.

Allocation:=Same form==TRUE && phase shift==180°

According to the complete output partial discharge matrix with area allocation 60, this applies to the basic forms Tower 1 and Tower 3, the basic forms Tower 2 and Tower 4 and the basic forms Fin 1 and Fin 2. Accordingly, the basic forms Tower 1 and Tower 3 are allocated as belonging together, the basic forms Tower 2 and Tower 4 are allocated as belonging together and the basic forms Fin 1 and Fin 2 are allocated as belonging together.

According to another fault rule, the interference signal of an HS test set is characterized in that there are two pairs of the basic form Tower, the first pair of which is separated from one another by a phase position of 180° and the second pair of which is also separated from one another by 180° and is shifted by 45° phase with respect to the first pair. The corresponding fault rule is the following:

Match:=FormA==Pole && FormB==Pole && PhaseOffSet==45

According to another fault rule, a test set is assumed to be a partial discharge source if there are exactly four basic forms Tower, i.e. if the following formula is fulfilled:

TestSet:=number of areas==4&& number of towers==4

The formulas for merging a plurality of areas into area groups is considered satisfied if the result of the formula is greater than "0.7".

According to another fault rule, a partial discharge pulse area basic form is allocated to the partial discharge source Cavity if it is a group from a single area of the basic form Sickle, and it is neither within the maximum nor within the zero crossing of the test voltage, i.e. if the formula, compared to all other fault rules, yields the greatest probability:

Cavity:=number areas==1&& number Sickle==1&& proximity maximum==FALSE && proximity zero crossing==FALSE According to another fault rule, the partial discharge source Detachment is present if there are two basic forms Fins which are separated from one another by a phase of 180° and are neither within the maximum nor within the zero crossing, i.e. if the following formula, compared to all other fault rules, yields the greatest probability:

Detachment==number areas==2&& number fins==2&& proximity maximum==FALSE && proximity zero crossing==FALSE Other common types of fault rules are, for example, apexes:

Apex:=number areas==1&& number Spot==1&& proximity maximum==true or free particles Particle:=number Areas==2&& number Hill==2&& proximity maximum==True The proximity of the maximum and the proximity of the zero crossing may be calculated as follows.

Proximity maximum:=phase angle of the centroid with respect to the next zero crossing/180°

Proximity zero crossing: =(phase angle of the centroid with respect to the next zero crossing+ 90°)/90°

Principally, the conformity of the basic forms with these fault rules is checked. The result of such a check may also be a probability value indicating the probability of the conformity of one or more basic forms with the respectively considered fault rule.

In the present embodiment, the four basic forms Tower 1 through Tower 4 at phase positions 20, 60, 200 and 240°, respectively, were allocated to the partial discharge source test set using the fault rule test set, the basic forms Fin 1 and Fin 2 were allocated to the partial discharge source using the fault rule detachment, and the basic form sickle was allocated to the partial discharge source cavity using the fault rule cavity.

The result obtained by means of the method of identifying one or more simultaneous occurring partial discharge sources from partial discharge measurements data according to the presently described embodiment is that the partial discharge measurement signals, which form the basis for the complete output partial discharge matrix 6 from FIG. 2 and from which the complete output partial discharge matrix 6 was created, are characteristic of the partial discharge sources test set, cavity and detachment. In other words, a test set, a cavity and a detachment are present in the gas-insulated system, which may cause undesired partial discharges and thus problems.

This result makes it possible to filter the test set as interference signal, and to remove or correct the cavity and the detachment in the gas-insulated system in order to prevent problems or damage.

LIST OF REFERENCE SIGNS

2 Extract of partial discharge measurement
4 Partial discharge matrix
6 Complete output partial discharge matrix
8 Partial discharge matrix
10 Query Sequence
12 Structogram Iterative area allocation method
14 Calculation partial matrix Diagonal aspect
16 Calculation partial matrix Cross aspect
18 Calculation partial matrix Diagonal aspect adjacent arrays
20 Calculation partial matrix Cross aspect adjacent arrays
22 Partial matrix Deviation value
24 Partial matrix Area number at the outset
26 Partial matrix Area number after the first allocation step
30 Partial discharge matrix with area allocation
32 Complete output partial discharge matrix with area allocation
34 Basic form Spot
36 Basic form Hill
38 Basic form Flame
40 Basic form Tower
42 Basic form Sickle
44 Basic form Fin
46 Basic form Platform
48 Calculation matrix Envelope
50 Calculation matrix FreeCorners
52 Calculation matrix FreeSides
54 Calculation matrix Symmetry
56 Table Actual Values Area Parameter
58 Table Area Allocation Areas
60 Table for determining the probability value of the conformity of area 1 with the rule set Sickle
62 Table for determining the probability value of the conformity of area 1 with the rule set Fin
64 Table for determining the probability value of the conformity of area 1 with the rule set Tower
66 Complete output partial discharge matrix with area allocation
68 Complete output partial discharge matrix with allocation of the causative partial discharge sources

The invention claimed is:

1. A method comprising:
obtaining partial discharge measurement signals of an electrical device to which an AC voltage is applied, said electrical device selected from the group consisting of a gas-insulated system, a high-voltage generator, a transformer, an electrical high-voltage power line, and an electrical cable; and
identifying one or more simultaneously occurring partial discharge sources from said partial discharge measurement signals of said electrical device, the identifying comprising:
on the basis of a frequency matrix in a computer system into which measured partial discharge pulses are entered as partial discharge pulse matrix arrays according to a detected pulse amplitude and to a detected phase position and in which partial discharge pulse matrix arrays are allocated to at least one enclosed area of partial discharge pulse matrix arrays, the computer system determining area parameters of the at least one enclosed area of partial discharge pulse matrix arrays;
the computer system comparing, for each enclosed area of partial discharge pulse matrix arrays, area parameters of the enclosed area of partial discharge pulse matrix arrays to predetermined rule sets, with each rule set corresponding to a characteristic partial discharge pulse area basic form; and allocating, for each enclosed area of partial discharge pulse matrix arrays, that rule set to the enclosed area which best corresponds to the enclosed area, such that one partial discharge pulse area basic form is allocated to each enclosed area of partial discharge pulse matrix arrays; and the computer system applying predetermined fault rules, which allocate characteristic partial discharge pulse area basic forms and characteristic combinations of partial discharge pulse area basic forms to known partial discharge sources, to ascertained partial discharge pulse area basic forms in order to determine those partial discharge sources which have rendered corresponding partial discharge pulses, wherein the area parameters of the at least one enclosed area of partial discharge pulse matrix arrays are at least one area parameter from the following group:

area share=number of the partial discharge pulse matrix arrays in an enveloping rectangle / number of all matrix arrays in the enveloping rectangle;

aspect ratio of the enveloping rectangle=vertical extension / horizontal extension of the enveloping rectangle;

free corners of the enveloping rectangle=corners of the enveloping rectangle at which all matrix arrays are free;

free side centers of the enveloping rectangle=side centers of the enveloping rectangle at which all matrix arrays are free;

curvature to the left;

curvature to the right;

curvature on the top;

curvature on the bottom;

vertical symmetry=symmetry around the vertical center axis; and horizontal symmetry=symmetry around the horizontal center axis.

2. The method according to claim 1, wherein said frequency matrix, into which measured partial discharge pulses are entered as partial discharge pulse matrix arrays according to the detected pulse amplitude and to the detected phase position, is first formed, and/or wherein, in the frequency matrix, partial discharge pulse matrix arrays are allocated to at least one enclosed area of partial discharge pulse matrix arrays.

3. The method according to claim 1, wherein the partial discharge pulse matrix arrays in the frequency matrix have respective chain lengths and are allocated to at least one enclosed area of partial discharge pulse matrix arrays on the basis of their chain lengths.

4. The method according to claim 3, wherein, when allocating the partial discharge pulse matrix arrays in the frequency matrix to at least one enclosed area of partial discharge pulse matrix arrays, at first the properties length of contiguous partial discharge pulse matrix arrays in the horizontal direction, length of contiguous partial discharge pulse matrix arrays in the vertical direction, length of contiguous partial discharge pulse matrix arrays in the diagonally ascending direction and length of contiguous partial discharge pulse matrix arrays in the diagonally descending direction are allocated for each partial discharge pulse matrix array.

5. The method according to claim 4, wherein, when allocating the partial discharge pulse matrix arrays in the frequency matrix to at least one enclosed area of partial discharge pulse matrix arrays, the property length of contiguous partial discharge pulse matrix arrays in the horizontal direction is put into relation with the property length of contiguous partial discharge pulse matrix arrays in the vertical direction for each partial discharge pulse matrix array in order to determine the deduced property cross aspect, and/or wherein, for each partial discharge pulse matrix array, the property length of contiguous partial discharge pulse matrix arrays in the diagonally ascending direction is put into relation with the property length of contiguous partial discharge pulse matrix arrays in the diagonally descending direction in order to determine the deduced property diagonal aspect.

6. The method according to claim 5, wherein, when allocating the partial discharge pulse matrix arrays in the frequency matrix to at least one enclosed area of partial discharge pulse matrix, the properties cross aspect and diagonal aspect are used for adjacent partial discharge pulse matrix arrays in order to determine whether or not adjacent partial discharge pulse matrix arrays belong to the same enclosed area.

7. The method according to claim 5, wherein, when allocating the partial discharge pulse matrix arrays in the frequency matrix to at least one enclosed area of partial discharge pulse matrix arrays, the deviation of a partial discharge pulse matrix array from the horizontally, vertically and diagonally adjacent partial discharge pulse matrix arrays is determined in pairs for all partial discharge pulse matrix arrays, wherein the deduced properties cross aspect and diagonal aspect are used for this determination of similarity.

8. The method according to claim 6, wherein, when allocating the partial discharge pulse matrix arrays in the frequency matrix to at least one enclosed area of partial discharge pulse matrix arrays, the cross deviation for each partial discharge pulse matrix array is determined according to the following formula $$\text{cross deviation} = \text{abs}\left(\frac{\text{minimum}\left(\begin{array}{c}\text{cross aspect point,}\\ \text{cross aspect adjacent point}\end{array}\right)}{\text{maximum}\left(\begin{array}{c}\text{cross aspect point,}\\ \text{cross aspect adjacent point}\end{array}\right)} - 1\right),$$

wherein abs represents the absolute value, minimum (cross aspect point, cross aspect adjacent point) the minimum of the cross aspect value of the partial discharge pulse matrix array and the cross aspect value of the respectively considered horizontally, vertically and diagonally adjacent partial discharge pulse matrix array, and maximum (cross aspect point, cross aspect adjacent point) the maximum of the cross aspect value of the partial discharge pulse matrix array and the cross aspect value of the respectively considered horizontally, vertically and diagonally adjacent partial discharge pulse matrix array, the diagonal deviation is determined according to the following formula $$\text{diagonal deviation} = \text{abs}\left(\frac{\text{minimum}\left(\begin{array}{c}\text{diagonal aspect point,}\\ \text{diagonal aspect adjacent point}\end{array}\right)}{\text{maximum}\left(\begin{array}{c}\text{diagonal aspect point,}\\ \text{diagonal aspect adjacent point}\end{array}\right)} - 1\right),$$

wherein abs represents the absolute value, minimum (diagonal aspect point, diagonal aspect adjacent point) the minimum of the diagonal aspect value of the partial discharge pulse matrix array and the diagonal aspect value of the respectively considered horizontally, vertically and diagonally adjacent partial discharge pulse matrix array, and maximum (diagonal aspect point, diagonal aspect adjacent point) the maximum of the diagonal aspect value of the partial discharge pulse matrix array and the diagonal aspect value of the respectively considered horizontally, vertically and diagonally adjacent partial discharge pulse matrix array, and the deviation between cross deviation and diagonal deviation is determined according to the following formula deviation=max(cross deviation, diagonal deviation).

9. The method according to claim 8, wherein, when allocating the partial discharge pulse matrix arrays in the frequency matrix to at least one enclosed area of partial discharge pulse matrix arrays, the horizontally, vertically or diagonally adjacent partial discharge pulse matrix array having the greatest still admissible deviation below a predetermined maximum deviation is determined for each partial discharge pulse matrix array.

10. The method according to claim 9, wherein the partial discharge pulse matrix arrays in the frequency matrix are allocated to at least one enclosed area of partial discharge pulse matrix arrays by sequentially analyzing, for each partial discharge pulse matrix array, the partial discharge pulse matrix array and the horizontally, vertically or diagonally adjacent partial discharge pulse matrix array having the greatest still admissible deviation below a predetermined maximum deviation; and by, if both partial discharge pulse matrix arrays have not yet been assigned an area number, allocating the partial discharge pulse matrix array to a new area number; if the area number of the adjacent partial discharge pulse matrix array is greater than the area number of the partial discharge pulse matrix array, allocating the area number of the adjacent partial discharge pulse matrix array to the partial discharge pulse matrix array; and, if neither of the two conditions is met, maintaining the area number of the partial discharge pulse matrix array and continuing with the allocation of the next partial discharge pulse matrix array.

11. The method according to claim 10, wherein said allocation is repeated for all partial discharge pulse matrix arrays until the area numbers no longer change.

12. The method according to claim 10, wherein, when allocating the partial discharge pulse matrix arrays in the frequency matrix to at least one enclosed area of partial discharge pulse matrix arrays, those matrix arrays which are not partial discharge pulse matrix arrays are not considered.

13. The method according to claim 10, wherein a partial discharge pulse matrix array is only allocated if the deviation for the considered partial discharge pulse matrix array is below a predetermined maximum deviation value, which ranges between 0.6 and 0.8 and is preferably approx. 0.7; otherwise, the procedure continues with the allocation of the next partial discharge pulse matrix array.

14. The method according to claim 1, wherein, when allocating the partial discharge pulse matrix arrays in the frequency matrix to at least one enclosed area of partial discharge pulse matrix arrays, all partial discharge pulse matrix arrays the area of which is too small are removed, wherein an area is in particular too small if it comprises less than 10 partial discharge pulse matrix arrays and/or if its horizontal or vertical extension is below 8 partial discharge pulse matrix arrays.

15. The method according to claim 1, wherein, in the step of comparing area parameters of the enclosed area of partial discharge pulse matrix arrays to predetermined rule sets for each enclosed area of partial discharge pulse matrix arrays, a probability value is allocated to each enclosed area, said probability value corresponding to the probability of the conformity of the enclosed area with the partial discharge pulse area basic form of a characteristic partial discharge source signal.

16. The method according to claim 15, wherein the probability of the conformity of the actual value with the target value is calculated by means of a continuous function, and wherein at least one of the functions $$F1 := e^{-\ln(tolerance\ value)}\left(\frac{actual\ value - target\ value}{tolerance\ width}\right)^2$$

$$F2 := 0.5 + \arctan(normalization * (deviation - actual\ value))$$

$$F2 := 0.5 + \arctan(normalization * (deviation + actual\ value))$$

is used as the continuous function.

\* \* \* \* \*